(12) United States Patent
Choi et al.

(10) Patent No.: US 11,856,794 B2
(45) Date of Patent: Dec. 26, 2023

(54) SEMICONDUCTOR MEMORY DEVICE WITH SELECTION PATTERNS, STORAGE PATTERNS, AND A GAP FILL LAYER AND METHOD FOR FABRICATING THE SAME

(71) Applicant: SAMSUNG ELECTRONICS CO., LTD., Suwon-si (KR)

(72) Inventors: Dong Sung Choi, Hwaseong-si (KR); Jong Uk Kim, Yongin-si (KR); Kwang Min Park, Seoul (KR); Zhe Wu, Seoul (KR); Ja Bin Lee, Hwaseong-si (KR); Jae Ho Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 107 days.

(21) Appl. No.: 17/364,378

(22) Filed: Jun. 30, 2021

(65) Prior Publication Data
US 2022/0059615 A1 Feb. 24, 2022

(30) Foreign Application Priority Data
Aug. 24, 2020 (KR) ........................ 10-2020-0105869

(51) Int. Cl.
*H10B 63/00* (2023.01)
*H10N 70/00* (2023.01)

(52) U.S. Cl.
CPC .......... *H10B 63/24* (2023.02); *H10N 70/841* (2023.02); *H10N 70/8828* (2023.02)

(58) Field of Classification Search
CPC ........ H10B 63/24; H10B 63/80; H10B 63/84; H10N 70/841; H10N 70/8828; H10N 70/063; H10N 70/231; H10N 70/826; H10N 70/8825; H10N 70/882
See application file for complete search history.

(56) References Cited

U.S. PATENT DOCUMENTS

| | | | |
|---|---|---|---|
| 8,129,705 B2 | 3/2012 | Kinoshita et al. | |
| 9,716,129 B1 | 7/2017 | Sim et al. | |
| 9,748,311 B2 | 8/2017 | Fantini et al. | |
| 9,806,129 B2 | 10/2017 | Ravasio et al. | |
| 10,468,596 B2 | 11/2019 | Makala et al. | |
| 10,573,689 B2 | 2/2020 | Sciarrillo et al. | |
| 2009/0047777 A1* | 2/2009 | Nagano | H01L 21/76837 257/E21.294 |
| 2010/0032637 A1* | 2/2010 | Kinoshita | G11C 13/0004 257/773 |

(Continued)

*Primary Examiner* — Jerome Leboeuf
(74) *Attorney, Agent, or Firm* — Sughrue Mion, PLLC

(57) ABSTRACT

A semiconductor memory device includes a first memory cell provided on a substrate, a second memory cell provided on the substrate and spaced apart from the first memory cell, a passivation layer extending along a side surface of the first memory cell and a side surface of the second memory cell, and a gap fill layer covering the passivation layer. Each of the first memory cell and the second memory cell includes a selection pattern having ovonic threshold switching characteristics, and a storage pattern provided on the selection pattern. The passivation layer includes a lower portion filling a space between the selection pattern of the first memory cell and the selection pattern of the second memory cell, and an upper portion extending along a side surface of the storage pattern of each of the first memory cell and the second memory cell.

17 Claims, 47 Drawing Sheets

(56) References Cited

U.S. PATENT DOCUMENTS

| | | | |
|---|---|---|---|
| 2017/0244031 A1* | 8/2017 | Jeong | H10N 70/063 |
| 2020/0111957 A1 | 4/2020 | Kim et al. | |
| 2020/0119259 A1 | 4/2020 | Ahn et al. | |
| 2021/0280782 A1* | 9/2021 | Ahn | H10N 70/231 |
| 2021/0399053 A1* | 12/2021 | Futase | H10B 63/84 |

* cited by examiner

SEMICONDUCTOR MEMORY DEVICE WITH SELECTION PATTERNS, STORAGE PATTERNS, AND A GAP FILL LAYER AND METHOD FOR FABRICATING THE SAME

CROSS-REFERENCE TO RELATED APPLICATION

This application claims priority to Korean Patent Application No. 10-2020-0105869 filed on Aug. 24, 2020, in the Korean Intellectual Property Office, the disclosure of which is incorporated by reference herein in its entirety.

BACKGROUND

1. Field

The present disclosure relates to a semiconductor memory device and a method for fabricating the same, and more particularly, to a semiconductor memory device including a passivation layer and a gap fill layer, and a method for fabricating the same.

2. Description of Related Art

As semiconductor memory devices are increasingly highly integrated, high-performance memory devices having a fast operation, a low operating voltage, and the like may be required. Variable resistance memory devices having variable resistance characteristics are being developed. For example, the variable resistance memory device, a phase change random access memory (PRAM) device, a magnetic random access memory (MRAM) device, and a resistive random access memory (RRAM), and the like are being studied.

SUMMARY

One or more example embodiments provide a semiconductor memory device with improved performance and reliability.

One or more example embodiments also provide a method for fabricating a semiconductor memory device with improved performance and reliability.

According to an aspect of an example embodiment, there is provided a semiconductor memory device including a first memory cell provided on a substrate, a second memory cell provided on the substrate and spaced apart from the first memory cell, a passivation layer extending along a side surface of the first memory cell and a side surface of the second memory cell, and a gap fill layer covering the passivation layer. Each of the first memory cell and the second memory cell includes a selection pattern having ovonic threshold switching characteristics, and a storage pattern disposed on the selection pattern. The passivation layer includes a lower portion filling a space between the selection pattern of the first memory cell and the selection pattern of the second memory cell, and an upper portion extending along a side surface of the storage pattern of each of the first memory cell and the second memory cell. The gap fill layer is not interposed between the selection pattern of the first memory cell and the selection pattern of the second memory cell, and is interposed between the storage pattern of the first memory cell and the storage pattern of the second memory cell.

According to an aspect of an example embodiment, there is provided a semiconductor memory device including a substrate, a plurality of first conductive lines provided on the substrate, each of the plurality of first conductive lines extending in a first direction, a plurality of second conductive lines provided on the substrate, each of the plurality of second conductive lines extending in a second direction crossing the first direction, a plurality of memory cells respectively disposed at intersections of the plurality of first conductive lines and the plurality of second conductive lines, a passivation layer extending along a side surface of each of the plurality of memory cells, and a gap fill layer covering the passivation layer. Each of the plurality of memory cells includes a lower electrode pattern, a selection pattern, a middle electrode pattern, a storage pattern, and an upper electrode pattern that are sequentially stacked on the substrate. A thickness of the passivation layer surrounding the storage pattern is less than a thickness of the passivation layer surrounding the selection pattern.

According to embodiments, there is provided a semiconductor memory device including a substrate, a plurality of first conductive lines provided on the substrate, each of the plurality of first conductive lines extending in a first direction, a plurality of second conductive lines provided on the substrate, each of the plurality of second conductive lines extending in a second direction crossing the first direction, a plurality of memory cells respectively disposed at intersections of the plurality of first conductive lines and the plurality of second conductive lines, a passivation layer extending along a side surface of each of the plurality of memory cells, and a gap fill layer covering the passivation layer. Each of the plurality of the memory cells includes a selection pattern having ovonic threshold switching characteristics; and a storage pattern provided on the selection pattern. A width of the storage pattern is less than a width of the selection pattern.

BRIEF DESCRIPTION OF THE DRAWINGS

The above and other aspects and features of the disclosure will become more apparent by describing in detail example embodiments thereof with reference to the attached drawings, in which.

DETAILED DESCRIPTION OF THE EMBODIMENTS

Hereinafter, a semiconductor memory device according to example embodiments will be described with reference to FIGS. 1 to 7D.

Although the terms first, second, etc. may be used herein to describe various elements or components, these elements or components may not be limited by these terms. These terms are used to distinguish one element or component from another element or component. Thus, a first element or component discussed below could be termed a second element or component without departing from the teachings of the disclosure.

Figure 1:
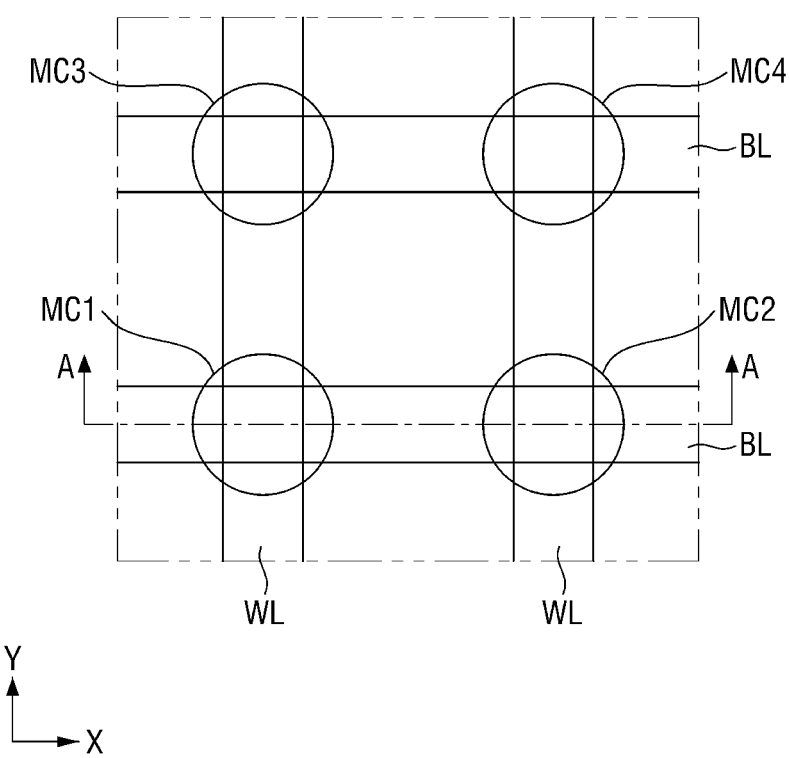
FIG. 1 is a layout diagram illustrating a semiconductor memory device according to example embodiments.
Figure 2:
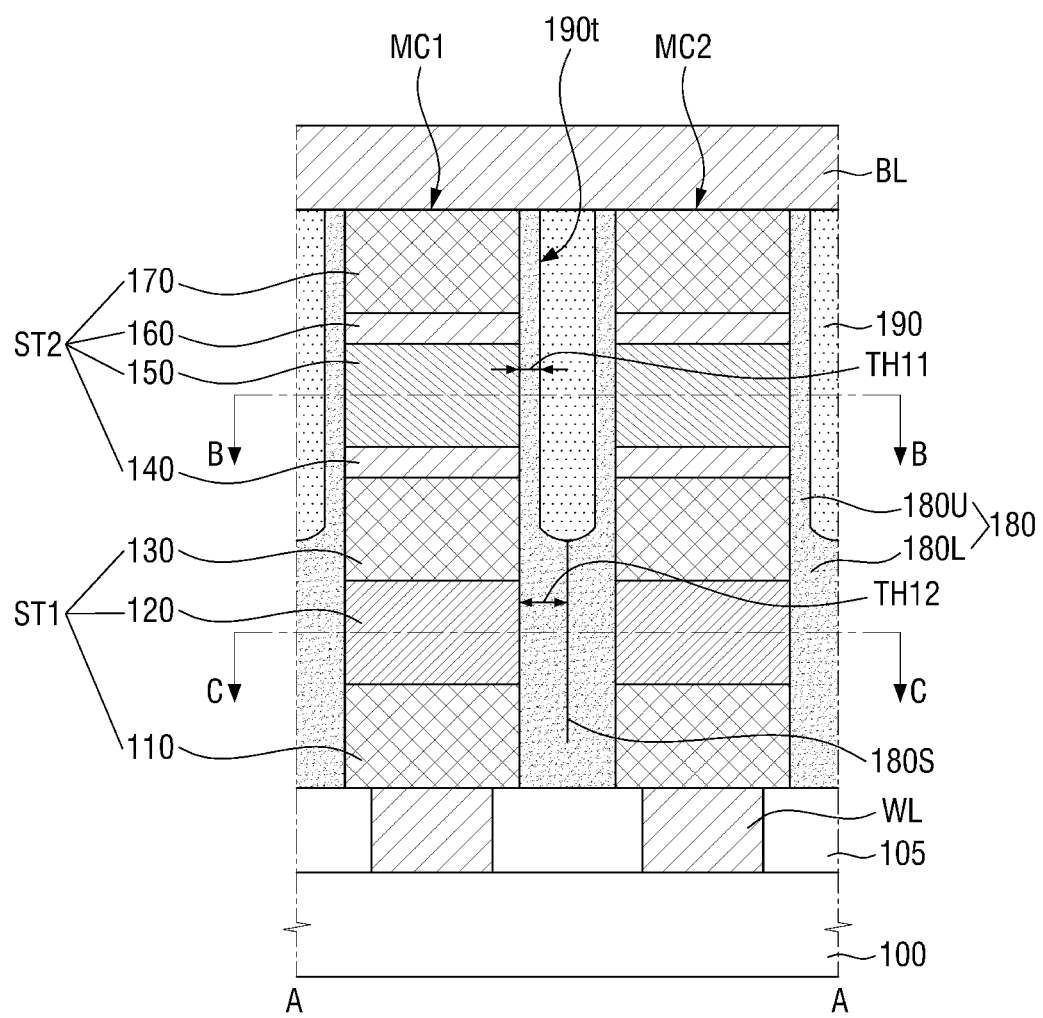
FIG. 2 is a cross-sectional view taken along line A-A of FIG. 1.

FIG. 1 is a layout diagram illustrating a semiconductor memory device according to example embodiments. FIG. 2 is a cross-sectional view taken along line A-A of FIG. 1. FIGS. 3A, 3B, 3C and 3D are various cross-sectional views taken along lines B-B and C-C of FIG. 2.

Referring to FIGS. 1 to 3D, a semiconductor memory device according to example embodiments includes a substrate 100, a first conductive line WL, a second conductive line BL, an interlayer insulating layer 105, and a plurality of memory cells MC1 to MC4, a passivation layer 180, and a gap fill layer 190.

The substrate 100 may be a semiconductor substrate. For example, the substrate 100 may be a bulk silicon or silicon-on-insulator (SOI) substrate. The substrate 100 may be a silicon substrate, or may include other materials such as silicon germanium, indium antimonide, lead tellurium compound, indium arsenide, indium phosphide, gallium arsenide, or gallium antimonide. Alternatively, the substrate 100 may have an epitaxial layer formed on a base substrate.

The first conductive line WL may be formed on the substrate 100. A plurality of first conductive lines WL may be spaced apart from each other and extend side by side. For example, each of the first conductive lines WL may extend in a first direction Y parallel to the top surface of the substrate 100.

The second conductive line BL may be formed on the substrate 100. A plurality of second conductive lines BL may be spaced apart from each other and extend side by side. The second conductive line BL may cross the first conductive line WL. For example, each of the second conductive lines BL may be parallel to the top surface of the substrate 100 and may extend in a second direction X crossing the first direction Y.

The first conductive line WL and the second conductive line BL may each include any one or any combination tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), or a combination thereof, but are not limited thereto. The first conductive line WL and the second conductive line BL may include the same material or may include different materials. In embodiments, each of the first conductive line WL and the second conductive line BL may include tungsten (W).

In some embodiments, the first conductive line WL may be a word line, and the second conductive line BL may be a bit line.

The interlayer insulating layer 105 may be formed on the substrate 100. The interlayer insulating layer 105 may electrically separate the plurality of first conductive lines WL. For example, the interlayer insulating layer 105 may cover the side surface of the first conductive line WL and the top surface of the substrate 100. The interlayer insulating layer 105 may include, for example, any one or any combination silicon oxide, silicon nitride, silicon oxynitride, or a combination thereof, but is not limited thereto.

The plurality of memory cells MC1 to MC4 may be formed on the substrate 100 and the interlayer insulating layer 105. Each of the memory cells MC1 to MC4 may be disposed at an intersection of the first conductive line WL and the second conductive line BL. In addition, each of the memory cells MC1 to MC4 may electrically connect the first conductive line WL to the second conductive line BL.

The memory cells MC1 to MC4 may be spaced apart from each other to form a plurality of isolated areas. For example, the memory cells MC1 to MC4 may include first to fourth memory cells MC1 to MC4 spaced apart from each other. The first memory cell MC1 and the second memory cell MC2 may be arranged along the second direction X, and the first memory cell MC1 and the third memory cell MC3 may be arranged along the first direction Y. The fourth memory cell MC4 may be arranged along the first direction Y with the second memory cell MC2, and may be arranged along the second direction X with the third memory cell MC3. That is, the first memory cell MC1 and the second memory cell MC2 may be arranged in a diagonal direction.

In some embodiments, the first memory cell MC1 and the second memory cell MC2 may share the second conductive line BL, and the first memory cell MC1 and the third memory cell MC3 may share the first conductive line WL. Similarly, the second memory cell MC2 and the fourth memory cell MC4 may share the first conductive line WL, and the third memory cell MC3 and the fourth memory cell MC4 may share the second conductive line BL.

Each of the memory cells MC1 to MC4 is illustrated to have a cylindrical shape, but this is only an example. For example, it goes without saying that each of the memory cells MC1 to MC4 may have various shapes such as a rectangular column.

Each of the memory cells MC1 to MC4 may include a lower electrode pattern 110, a selection pattern 120, a middle electrode pattern 130, a storage pattern 150, and an upper electrode pattern 170 that are sequentially stacked on the substrate 100.

The lower electrode pattern 110 may be interposed between the first conductive line WL and the selection pattern 120. The lower electrode pattern 110 may electrically connect the first conductive line WL to the selection pattern 120. The lower electrode pattern 110 may include, for example, any one or any combination a metal such as tungsten (W), platinum (Pt), palladium (Pd), rhodium (Rh), ruthenium (Ru), iridium (Ir), copper (Cu), aluminum (Al), titanium (Ti), tantalum (Ta), a metal nitride such as titanium nitride (TiN), or a combination thereof, but is not limited thereto. In some embodiments, the lower electrode pattern 110 may include a carbon (C) layer.

The selection pattern 120 may be interposed between the lower electrode pattern 110 and the middle electrode pattern 130. The selection pattern 120 may control the current flow of the memory cells MC1 to MC4.

In some embodiments, the selection pattern 120 may have ovonic threshold switching (OTS) characteristics. That is, when the selection pattern 120 is in the off state (high resistance state), the selection pattern 120 may be changed into the on state (low resistance state) when a voltage greater than or equal to a voltage (threshold switching voltage) is applied to the selection pattern 120. Conversely, when the selection pattern 120 is in the on state (low resistance state), the selection pattern 120 may have a property to be restored to the off state (high resistance state) when the voltage applied to the selection pattern 120 is lowered to a voltage (sustain voltage) or less.

The selection pattern 120 may include, for example, a chalcogenide material. The chalcogenide material may include a compound that is formed by a combination of any one or any combination Te and Se, which are chalcogen elements, and any one or any combination Ge, Sb, Bi, Al, Pb, Sn, Ag, As, S, Si, In, Ti, Ga, or P. For example, the selection pattern 120 may include any one or any combination AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, or GeAsBiSe.

The middle electrode pattern 130 may be interposed between the selection pattern 120 and the storage pattern 150. The middle electrode pattern 130 may electrically connect the selection pattern 120 to the storage pattern 150. The middle electrode pattern 130 may include, for example, metal nitride or metal silicon nitride such as titanium nitride (TiN), titanium silicon nitride (TiSiN), tungsten nitride (WN), tungsten silicon nitride (WSiN), tantalum nitride (TaN), tantalum silicon nitride (TaSiN), zirconium nitride (ZrN), and zirconium silicon nitride (ZrSiN), but is not limited thereto. In some embodiments, the middle electrode pattern 130 may include a carbon (C) layer.

The storage pattern 150 may be interposed between the middle electrode pattern 130 and the upper electrode pattern 170. The storage pattern 150 may electrically connect the middle electrode pattern 130 to the upper electrode pattern 170. The storage pattern 150 may be a phase change pattern. That is, the storage pattern 150 may store data by changing resistance according to a temperature change.

The storage pattern 150 may include, for example, a compound that is formed by a combination of any one or any combination Te and Se, which are chalcogen elements, and any one or any combination Ge, Sb, Bi, Pb, Sn, Ag, As, S, Si, In, Ti, Ga, P, O, or C. For example, the storage pattern 150 may include any one or any combination GeSbTe, GeTeAs, SbTeSe, GeTe, SbTe, SeTeSn, GeTeSe, SbSeBi, GeBiTe, GeTeTi, InSe, GaTeSe, or InSbTe. In some embodiments, the storage pattern 150 may include GeSbTe (GST).

Figure 3A:
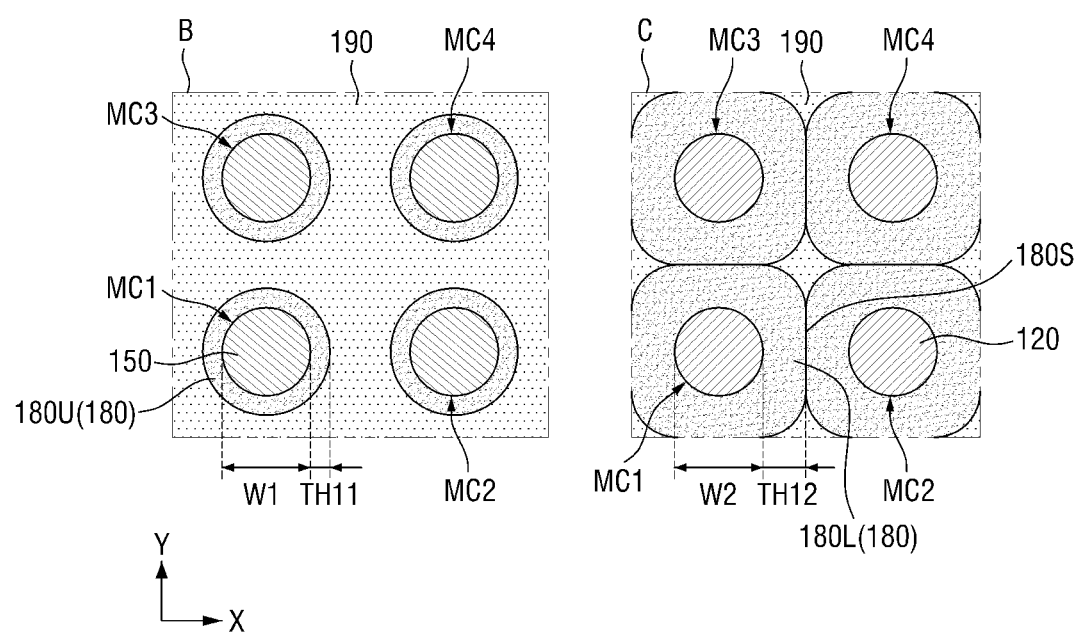
FIGS. 3A, 3B, 3C and 3D are various cross-sectional views taken along lines B-B and C-C of FIG. 2.

In some embodiments, a first width W1 of the storage pattern 150 may be the same as a second width W2 of the selection pattern 120. The term "same" as used herein not only means being completely identical but also includes a minute difference that may occur due to a process margin and the like. Here, the first width W1 and the second width W2 mean widths in a direction parallel to the top surface of the substrate 100. For example, as illustrated in FIG. 3A, each of the first width W1 and the second width W2 may be defined as a width in the second direction X.

In some embodiments, the first barrier pattern 140 may be interposed between the middle electrode pattern 130 and the storage pattern 150. The first barrier pattern 140 may prevent a material included in the middle electrode pattern 130 from diffusing into the storage pattern 150 and causing deterioration of the characteristics of the storage pattern 150. The first barrier pattern 140 may include, for example, tungsten (W), but is not limited thereto.

The upper electrode pattern 170 may be interposed between the storage pattern 150 and the second conductive line BL. The upper electrode pattern 170 may electrically connect the storage pattern 150 to the second conductive line BL. The upper electrode pattern 170 may include, for example, any one or any combination a metal such as tungsten (W), platinum (Pt), palladium (Pd), rhodium (Rh), ruthenium (Ru), iridium (Ir), copper (Cu), aluminum (Al), titanium (Ti), tantalum (Ta), a metal nitride such as titanium nitride (TiN), or a combination thereof, but is not limited thereto. In some embodiments, the upper electrode pattern 170 may include a carbon (C) layer.

In some embodiments, the second barrier pattern 160 may be interposed between the storage pattern 150 and the upper electrode pattern 170. The second barrier pattern 160 may prevent a material included in the upper electrode pattern 170 from diffusing into the storage pattern 150 and causing deterioration of the characteristics of the storage pattern 150. The second barrier pattern 160 may include, for example, tungsten (W), but is not limited thereto.

Each of the memory cells MC1 to MC4 may include a first stack ST1 including the selection pattern 120 and a second stack ST2 including the storage pattern 150. In some embodiments, the first stack ST1 may include the lower electrode pattern 110, the selection pattern 120, and the middle electrode pattern 130, and the second stack ST2 may include the first barrier pattern 140, the storage pattern 150, the second barrier pattern 160, and the upper electrode pattern 170.

In some embodiments, the width of the first stack ST1 and the width of the second stack ST2 may be the same.

The passivation layer 180 may extend along the side surface of each of the memory cells MC1 to MC4. For example, as illustrated in FIG. 2, the passivation layer 180 may extend along the side surface of the first memory cell MC1, the side surface of the second memory cell MC2, and the top surface of the interlayer insulating layer 105. In addition, as illustrated in FIG. 3A, the passivation layer 180 may surround the side surface of each of the memory cells MC1 to MC4.

The passivation layer 180 may include a lower portion 180L and an upper portion 180U above the lower portion 180L. The lower portion 180L of the passivation layer 180 may cover the side surface of the selection pattern 120. For example, the lower portion 180L of the passivation layer 180 may extend along the side surface of the first stack ST1. The upper portion 180U of the passivation layer 180 may cover the side surface of the storage pattern 150. For example, the upper portion 180U of the passivation layer 180 may extend from the lower portion 180L of the passivation layer 180 and extend along the side surface of the second stack ST2.

The upper portions 180U of the passivation layer 180 extending along the side surfaces of the storage patterns 150 of the memory cells MC1 to MC4 may be spaced apart from each other. For example, as illustrated in FIGS. 2 and 3A, the upper portion 180U of the passivation layer 180 extending along the side surface of the selection pattern 120 of the first memory cell MC1 may be spaced apart from the upper portion of the passivation layer 180 extending along the side surface of the selection pattern 120 of the second memory cell MC2.

The lower portion 180L of the passivation layer 180 may fill a space between the selection patterns 120 of the memory cells MC1 to MC4 adjacent to each other. For example, as illustrated in area C of FIGS. 2 and 3A, the lower portion 180L of the passivation layer 180 may fill the space between the selection pattern 120 of the first memory cell MC1 and the selection pattern 120 of the second memory cell MC2.

In some embodiments, the lower portions 180L of the passivation layer 180 surrounding the selection patterns 120 of the memory cells MC1 to MC4 adjacent to each other may be in contact with each other. For example, the lower portion 180L of the passivation layer 180 surrounding the selection pattern 120 of the first memory cell MC1 may be in contact with the lower portion 180L of the passivation layer 180 surrounding the selection pattern 120 of the second memory cell MC2.

In some embodiments, the lower portion 180L of the passivation layer 180 may include a seam 180S. The seam 180S may be a boundary of the lower portion 180L of the passivation layer 180 formed between the memory cells MC1 to MC4 adjacent to each other. For example, the seam 180S may be a boundary formed as a result of the lower portion 180L of the passivation layer 180 surrounding the selection pattern 120 of the first memory cell MC1 meeting the lower portion 180L of the passivation layer 180 surrounding the selection pattern 120 of the second memory cell MC2. The seam 180S may extend between the first memory cell MC1 and the second memory cell MC2 in a direction crossing the top surface of the substrate 100. In some embodiments, the seam 180S may be spaced apart from the top surface of the interlayer insulating layer 105.

However, in some embodiments, the lower portion 180L of the passivation layer 180 may not include the seam 180S. For example, according to the characteristics of the process of forming the lower portion 180L of the passivation layer 180, the seam 180S may not exist.

In some embodiments, a first thickness TH11 of the upper portion 180U of the passivation layer 180 may be smaller than a second thickness TH12 of the lower portion 180L of the passivation layer 180. As illustrated in FIGS. 2 and 3A, the first thickness TH11 may be defined as a distance from the side surface of the storage pattern 150 of each of the memory cells MC1 to MC4 to the gap fill layer 190 to be described later. In addition, the second thickness TH12 may be defined as a distance from the side surface of the selection pattern 120 of each of the memory cells MC1 to MC4 to the seam 180S of the passivation layer 180.

The passivation layer 180 may protect the memory cells MC1 to MC4. For example, the passivation layer 180 may protect the memory cells MC1 to MC4 from oxidation and moisture absorption in a fabricating process of a semiconductor memory device, and thus the selection pattern 120 may be prevented from dispersion and deterioration of characteristics. In some embodiments, the oxygen concentration of the selection pattern 120 may be 10% or less.

The passivation layer 180 may include, for example, any one or any combination silicon oxide, aluminum oxide, silicon nitride, silicon oxynitride, silicon carbide, silicon carbonitride, silicon oxycarbonitride, or a combination thereof, but is not limited thereto.

Although only a single layer of the passivation layer 180 is illustrated, this is only an example. For example, it goes without saying that the passivation layer 180 may be a multilayer stacked on the memory cells MC1 to MC4. For example, the passivation layer 180 may have a stacked structure of a silicon nitride layer (SiN) and a silicon carbonitride layer (SiCN). As another example, the passivation layer 180 may be a stacked structure of a silicon nitride layer (SiN) and a silicon oxide layer ($SiO_2$). As another example, the passivation layer 180 may be a stacked structure of a silicon nitride layer (SiN), a silicon oxide layer ($SiO_2$), and a silicon nitride layer (SiN).

The gap fill layer 190 may be formed on the passivation layer 180. The gap fill layer 190 may cover the passivation layer 180. The gap fill layer 190 may fill a space on the remaining side surfaces of the memory cells MC1 to MC4 after the passivation layer 180 is formed.

The gap fill layer 190 may fill a space between the storage patterns 150 of the memory cells MC1 to MC4 adjacent to each other. For example, as illustrated in area B of FIGS. 2 and 3A, the gap fill layer 190 may be interposed between the storage pattern 150 of the first memory cell MC1 and the storage pattern 150 of the second memory cell MC2. The gap fill layer 190 may fill a space between the upper portions 180U of the passivation layer 180 spaced apart from each other.

In some embodiments, the second conductive line BL may extend along the top surface of the upper electrode pattern 170, the top surface of the passivation layer 180, and the top surface of the gap fill layer 190.

In some embodiments, a recess 190t may be formed in the upper portion 180U of the passivation layer 180. The bottom surface of the recess 190t may be formed lower than the bottom surface of the storage pattern 150. The gap fill layer 190 may be formed to fill the recess 190t. Accordingly, the gap fill layer 190 may be interposed between the storage pattern 150 of the first memory cell MC1 and the storage pattern 150 of the second memory cell MC2. In some embodiments, the bottom surface of the recess 190t may be concave upward.

As described above, the lower portion 180L of the passivation layer 180 may fill the space between the selection patterns 120 of the memory cells MC1 to MC4 adjacent to each other. Accordingly, as illustrated in area C of FIGS. 2 and 3A, the gap fill layer 190 may not be interposed between the selection patterns 120 of the memory cells MC1 to MC4 adjacent to each other. For example, the gap fill layer 190 may not be interposed between the selection pattern 120 of the first memory cell MC1 and the selection pattern 120 of the second memory cell MC2.

In some embodiments, the bottom surface of the recess 190t may be formed higher than the top surface of the selection pattern 120. Accordingly, the gap fill layer 190 may not be interposed between the selection pattern 120 of the first memory cell MC1 and the selection pattern 120 of the second memory cell MC2.

In some embodiments, a portion of the gap fill layer 190 may be interposed between the selection patterns 120 of the memory cells MC1 to MC4 arranged in a diagonal direction. For example, as illustrated in area C of FIGS. 2 and 3A, the portion of the gap fill layer 190 may be interposed between the selection pattern 120 of the first memory cell MC1 and the selection pattern 120 of the fourth memory cell MC4 (or between the selection pattern 120 of the second memory cell MC2 and the selection pattern 120 of the third memory cell MC3).

The gap fill layer 190 may prevent interference between the adjacent memory cells MC1 to MC4. For example, the gap fill layer 190 may prevent heat from spreading between the memory cells MC1 to MC4 to prevent cross-talk between the storage patterns 150.

The gap fill layer 190 may include a material having a lower thermal conductivity than the passivation layer 180. For example, the gap fill layer 190 may include any one or any combination silicon oxide, silicon oxycarbide, or a low thermal conductivity material having a lower thermal conductivity than silicon oxide. For example, the gap fill layer 190 may include, for example, $SiO_2$, SiOC, spin-on glass (SOG), spin-on dielectric (SOD), high density plasma (HDP) oxide, flowable oxide (FOX), tonen silazene (TOSZ), undoped silicate glass (USG), borosilicate glass (BSG), phosphosilicate glass (PSG), borophosphosilicate glass (BPSG), tetra ethyl ortho silicate (TEOS), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SiLK, polyimide, a porous polymeric material, or a combination thereof, but is not limited thereto.

Figure 3B:
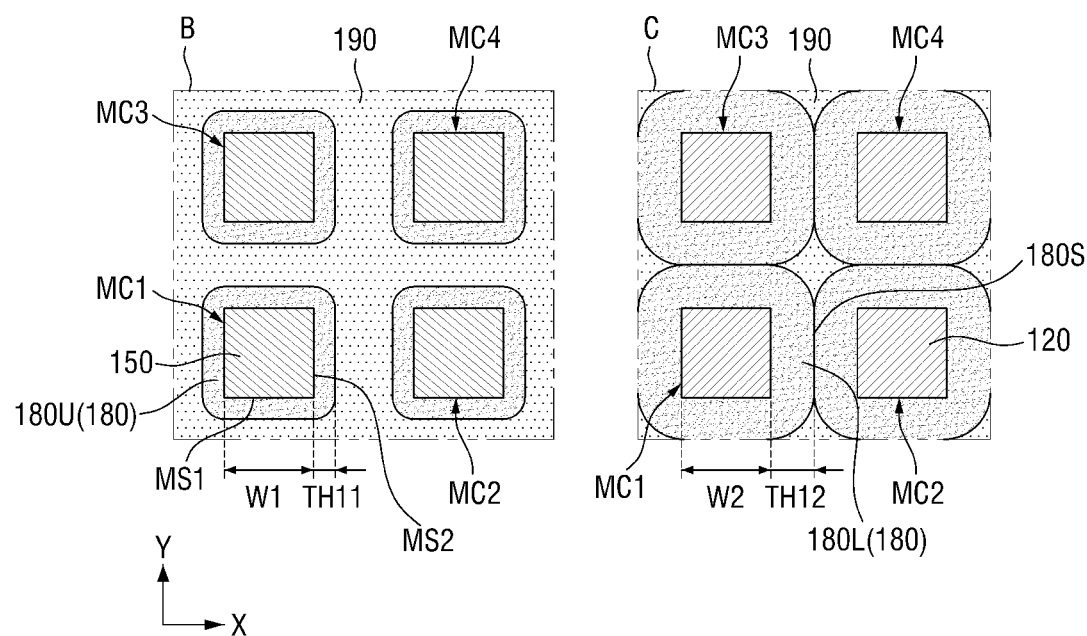

Referring to FIGS. 1, 2, and 3B, in the semiconductor memory device according to example embodiments, each of the memory cells MC1 to MC4 has a rectangular column shape.

For example, each of the memory cells MC1 to MC4 may include a first side surface MS1 extending in the second direction X and a second side surface MS2 extending in the first direction Y.

As described above, the upper portion 180U of the passivation layer 180 may surround the storage pattern 150, and the lower portion 180L of the passivation layer 180 may surround the selection pattern 120. Accordingly, the upper portion 180U of the passivation layer 180 may cover the first side surface MS1 and the second side surface MS2 of the storage pattern 150, and the lower portion 180L of the passivation layer 180 may cover the first side surface MS1 and the second side surface MS2 of the selection pattern 120.

Figure 3C:
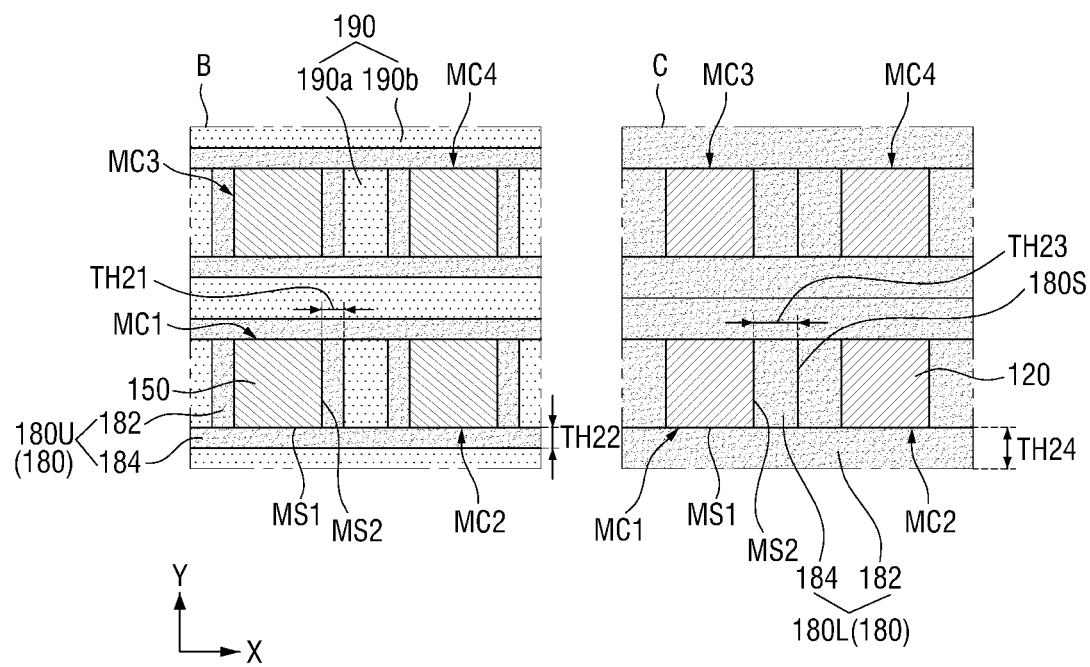

Referring to FIGS. 1, 2, and 3C, in the semiconductor memory device according to example embodiments, the passivation layer 180 includes a first layer 182 and a second layer 184.

The first layer 182 may extend in the first direction Y to cover the first side surface MS1 of each of the memory cells MC1 to MC4. The second layer 184 may extend in the second direction X to cover the second side surface MS2 of each of the memory cells MC1 to MC4.

In some embodiments, the gap fill layer 190 may include a first portion 190a and a second portion 190b. The first portion 190a of the gap fill layer 190 may be interposed between the upper portions 180U of the adjacent first layers 182. For example, the first portion 190a of the gap fill layer 190 interposed between the upper portions 180U of the adjacent first layers 182 may extend in the first direction Y. The second portion 190b of the gap fill layer 190 may be interposed between the upper portions 180U of the adjacent second layers 184. For example, the second portion 190b of the gap fill layer 190 interposed between the upper portions 180U of the adjacent second layers 184 may extend in the first direction Y.

In some embodiments, the first layer 182 may be cut by the second layer 184. For example, the second layer 184 may be elongated in the second direction X to cover the second side surface MS2 and the side surface of the first layer 182.

It has been illustrated only that a third thickness TH21 of the upper portion 180U of the first layer 182 and a fourth thickness TH22 of the upper portion 180U of the second layer 184 are the same, but this is only an example, and the technical spirit of the disclosure is not limited thereto. In addition, it has been illustrated only that a fifth thickness TH23 of the lower portion 180L of the first layer 182 and a sixth thickness TH24 of the lower portion 180L of the second layer 184 are also the same, but this is merely an example, and the technical spirit of the disclosure is not limited thereto.

In some embodiments, the third thickness TH21 of the upper portion 180U of the first layer 182 may be smaller than the fifth thickness TH23 of the lower portion 180L of the first layer 182. In addition, in some embodiments, the fourth thickness TH22 of the upper portion 180U of the second layer 184 may be smaller than the sixth thickness TH24 of the lower portion 180L of the second layer 184.

Figure 3D:
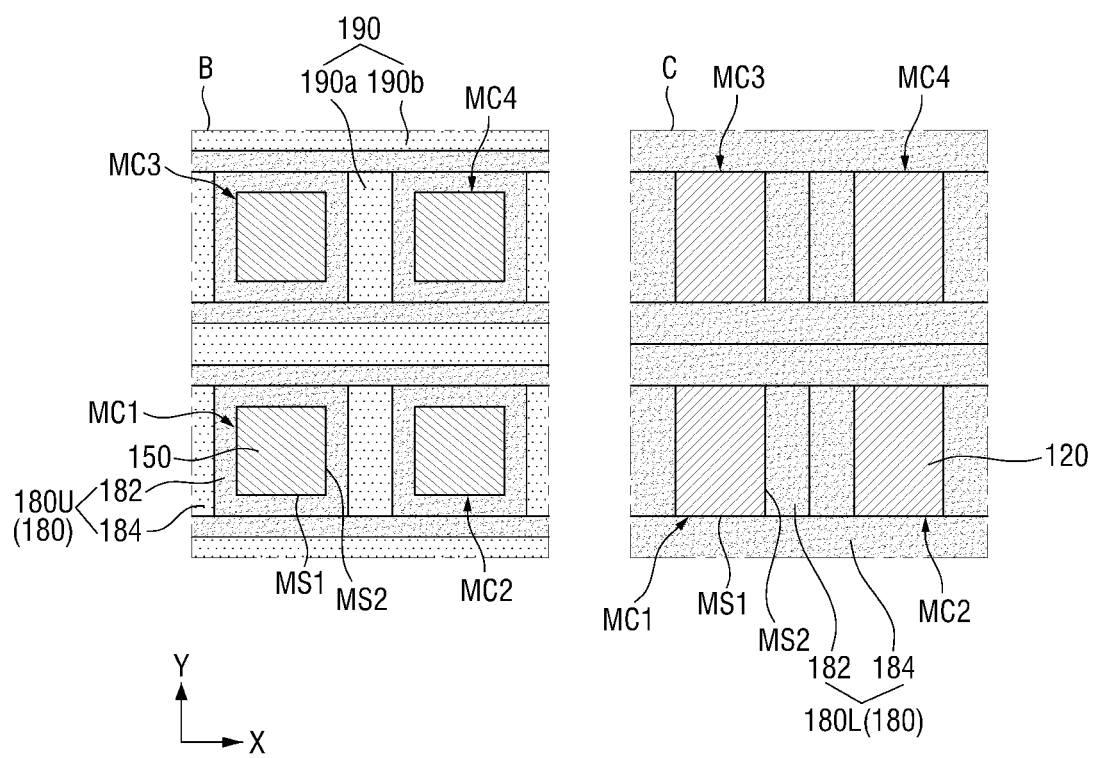

Referring to FIGS. 1, 2, and 3D, in the semiconductor memory device according to some example embodiments, the first layer 182 covers the first side surface MS1 and the second side surface MS2 of the storage pattern 150.

For example, the first layer 182 may surround the storage pattern 150. In embodiments, the second layer 184 may be spaced apart from the storage pattern 150 by the first layer 182. For example, the second layer 184 may be elongated in the second direction X to cover the side surface of the upper portion 180U of the first layer 182.

In some embodiments, the first layer 182 may not cover the first side surface MS1 of the selection pattern 120. For example, the second layer 184 may be elongated in the second direction X to cover the second side surface MS2 of the selection pattern 120 and the side surface of the lower portion 180L of the first layer 182.

A selection pattern including a chalcogenide material and having ovonic threshold switching (OTS) characteristics is damaged due to oxidation and moisture absorption in a fabricating process of a semiconductor memory device, and thus there is a problem of dispersion and deterioration of characteristics. To prevent this, a passivation layer having a predetermined thickness or more may be formed on side surfaces of the memory cells. However, such a passivation layer narrows the space for forming the gap fill layer, which causes to increase interference between adjacent storage patterns.

However, in the semiconductor memory device according to some embodiments, the passivation layer 180 may fill a space between the memory cells MC1 to MC4 in an area in which the selection pattern 120 is formed, and may provide a space for forming the gap fill layer 190 in an area in which the storage pattern 150 is formed. For example, as described above, the first thickness TH11 of the upper portion 180U of the passivation layer 180 extending along the storage pattern 150 may be smaller than the second thickness TH12 of the lower portion 180L of the passivation layer 180 extending along the selection pattern 120. Accordingly, dispersion and deterioration of characteristics of the selection pattern 120 may be prevented and interference between the storage patterns 150 may be prevented, and thus a semiconductor memory device with improved performance and reliability may be provided.

Figure 4A:
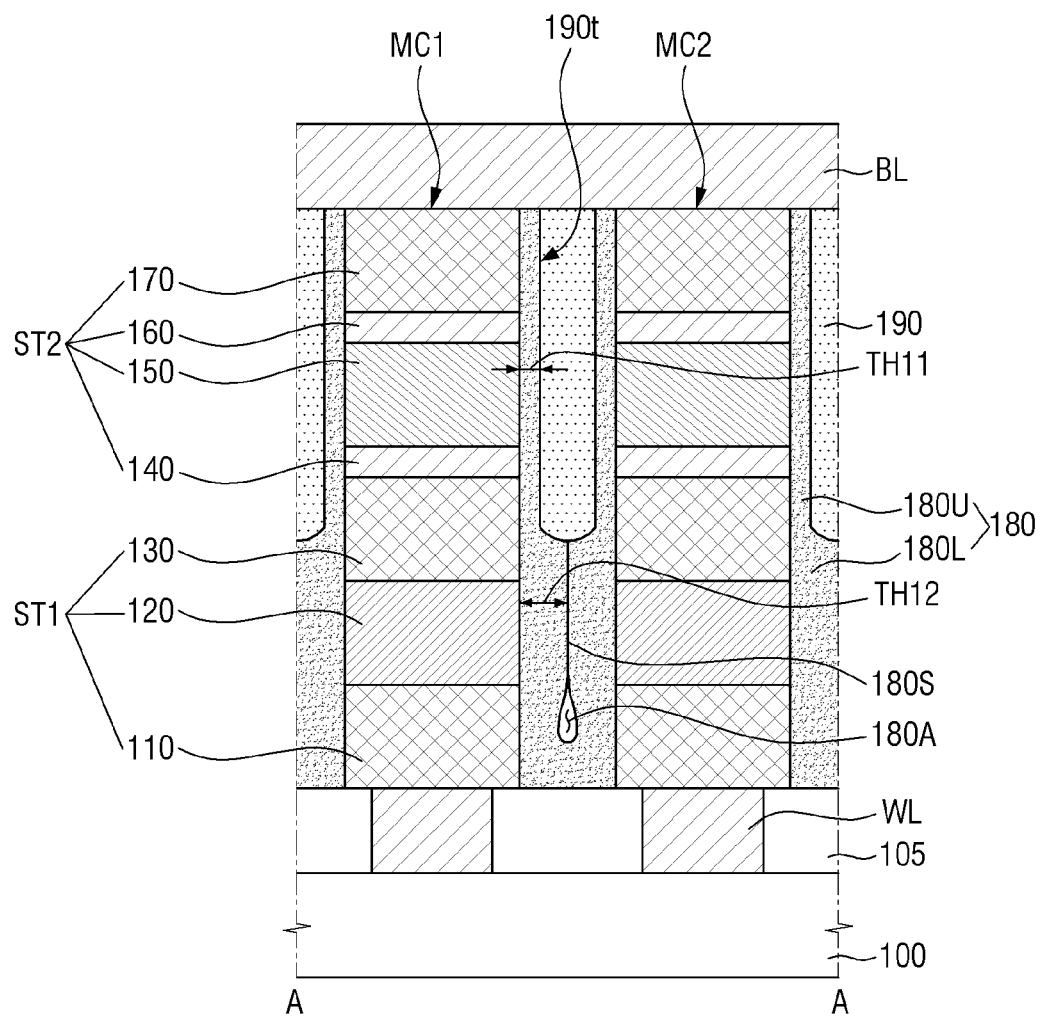
FIGS. 4A, 4B and 4C are various cross-sectional views illustrating a semiconductor memory device according to example embodiments.
Figure 4B:
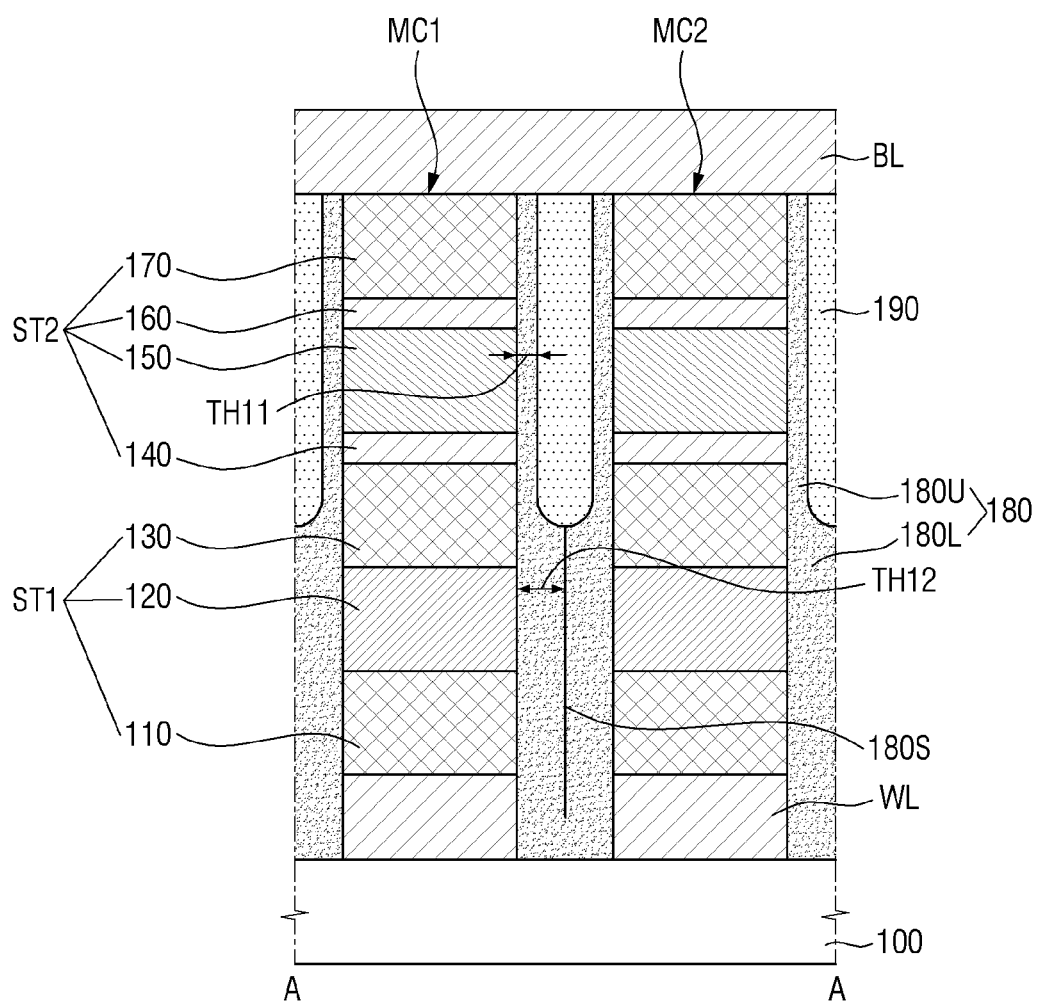
Figure 4C:
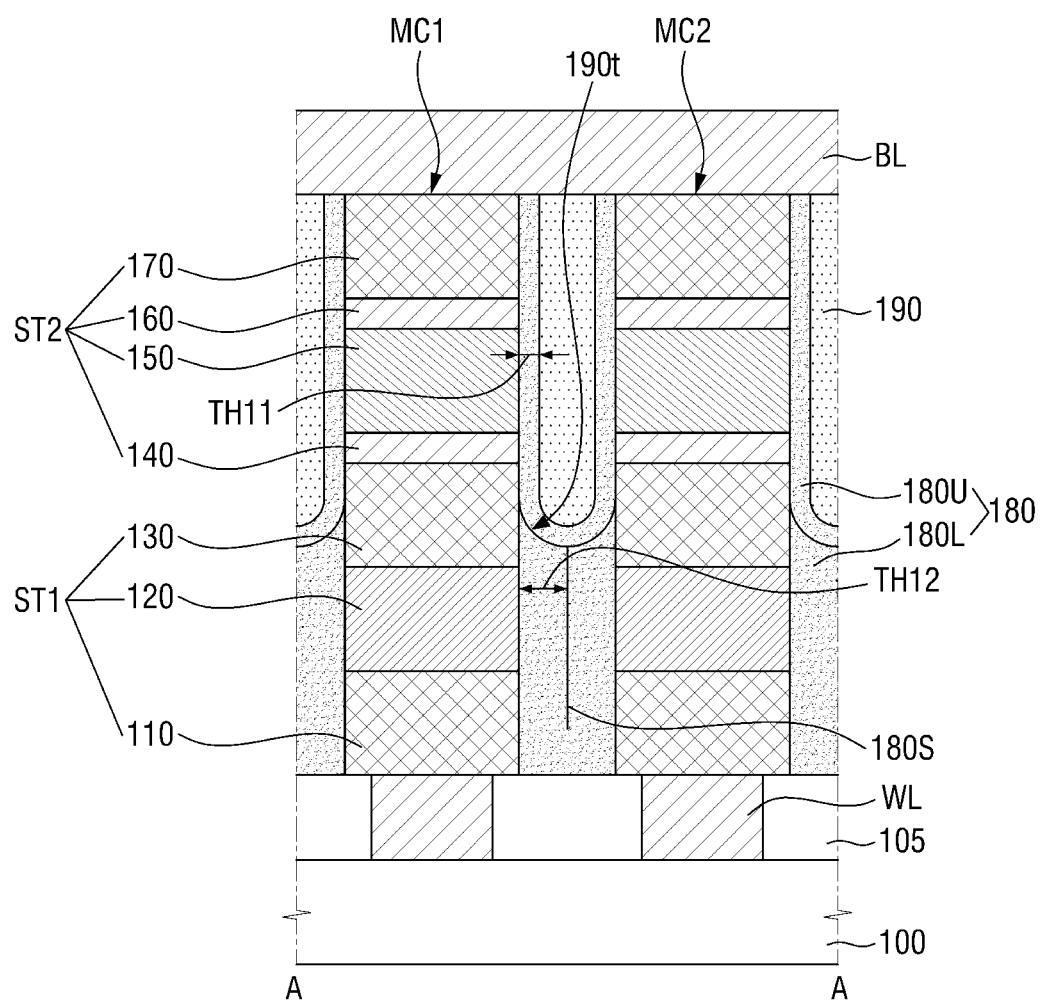

FIGS. 4A, 4B and 4C are various cross-sectional views illustrating a semiconductor memory device according to embodiments. For simplicity of description, redundant parts of the description made with reference to FIGS. 1 to 3D may be recapitulated or omitted.

Referring to FIG. 4A, in the semiconductor memory device according to embodiments, the passivation layer 180 includes a gap 180A.

The gap 180A may be an air gap or a void formed in the passivation layer 180. The gap 180 formed as an air gap or a void has a lower thermal conductivity than the passivation layer 180 or the gap fill layer 190, and thus interference between the adjacent memory cells MC1 to MC4 may be prevented.

Referring to FIG. 4B, in the semiconductor memory device according to some example embodiments, the width of the first conductive line WL is the same as the width of the first stack ST1 and/or the second stack ST2.

This may be due to the fact that the first conductive line WL is patterned simultaneously with the first stack ST1 and/or the second stack ST2, but is not limited thereto.

In some embodiments, the passivation layer 180 may further extend along the side surface of the first conductive line WL. For example, the passivation layer 180 may extend along the side surface of the first memory cell MC1, the side surface of the second memory cell MC2, the side surface of the first conductive line WL, and the top surface of the interlayer insulating layer 105.

FIG. 4C is a cross-sectional view illustrating a semiconductor memory device according to example embodiments. For simplicity of description, redundant parts of the description made with reference to FIGS. 1 to 3D may be recapitulated or omitted.

Referring to FIG. 4C, in the semiconductor memory device according to some embodiments, the upper portion 180U of the passivation layer 180 extends along the top surface of the lower portion 180L of the passivation layer 180.

For example, the recess 190t may expose the side surface of the second stack ST2 of each of the memory cells MC1 to MC4. In addition, the recess 190t may expose the top surface of the lower portion 180L of the passivation layer 180. The upper portion 180U of the passivation layer 180 may extend along the side surface and the bottom surface of the recess 190t. Accordingly, the upper portion 180U of the passivation layer 180 may extend along the side surface of the second stack ST2 and the top surface of the lower portion 180L of the passivation layer 180. In some embodiments, the upper portion 180U of the passivation layer 180 may conformally extend along the side surface of the second stack ST2 and the top surface of the lower portion 180L of the passivation layer 180.

As illustrated, a boundary surface may be formed between the lower portion 180L of the passivation layer 180 and the upper portion 180U of the passivation layer 180. This may be due to the fact that the lower portion 180L of the passivation layer 180 and the upper portion 180U of the passivation layer 180 are formed in different process steps.

In some embodiments, the seam 180S may extend to the upper portion 180U of the passivation layer 180.

In some embodiments, the top surface of the lower portion 180L of the passivation layer 180 may be concave upward. Accordingly, the bottom surface of the upper portion 180U of the passivation layer 180 may be convex downward.

Figure 5:
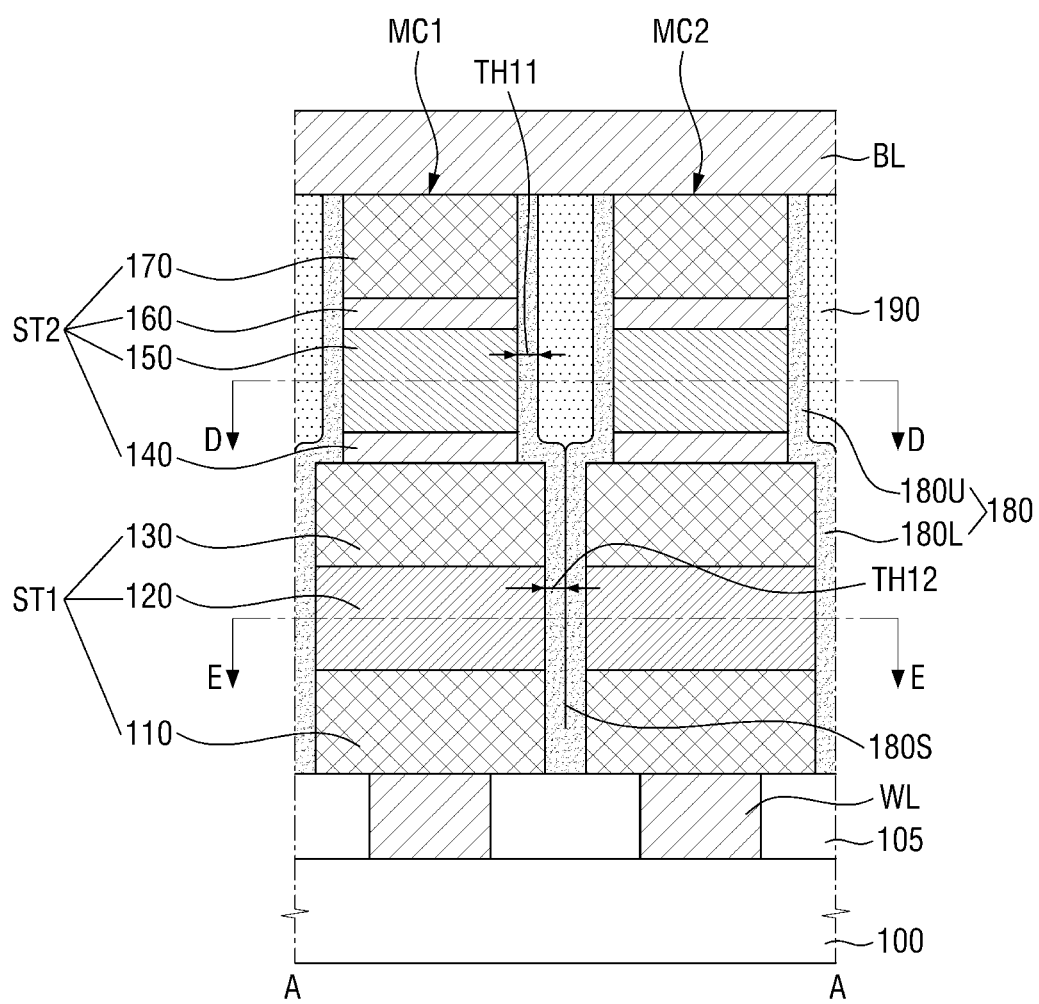
FIGS. 5 and 6 are various cross-sectional views illustrating a semiconductor memory device according to example embodiments.
Figure 6:
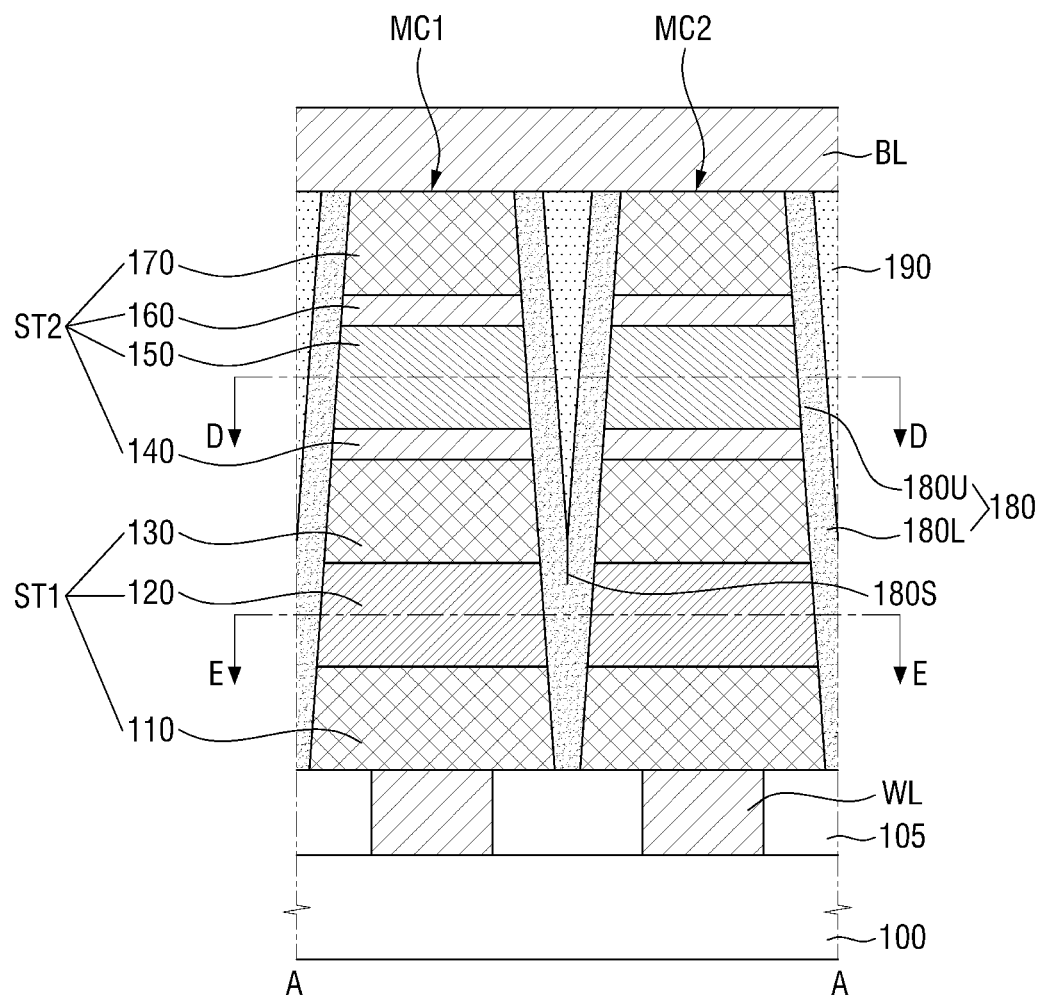

FIGS. 5 and 6 are various cross-sectional views illustrating a semiconductor memory device according to example embodiments. FIGS. 7A, 7B, 7C and 7D are various cross-sectional views taken along lines D-D and E-E of FIGS. 5 and 6. For simplicity of description, redundant parts of the description made with reference to FIGS. 1 to 3D may be recapitulated or omitted.

Referring to FIGS. 5 to 7D, in the semiconductor memory device according to some embodiments, the first width W1 of the storage pattern 150 is smaller than the second width W2 of the selection pattern 120.

Figure 7A:
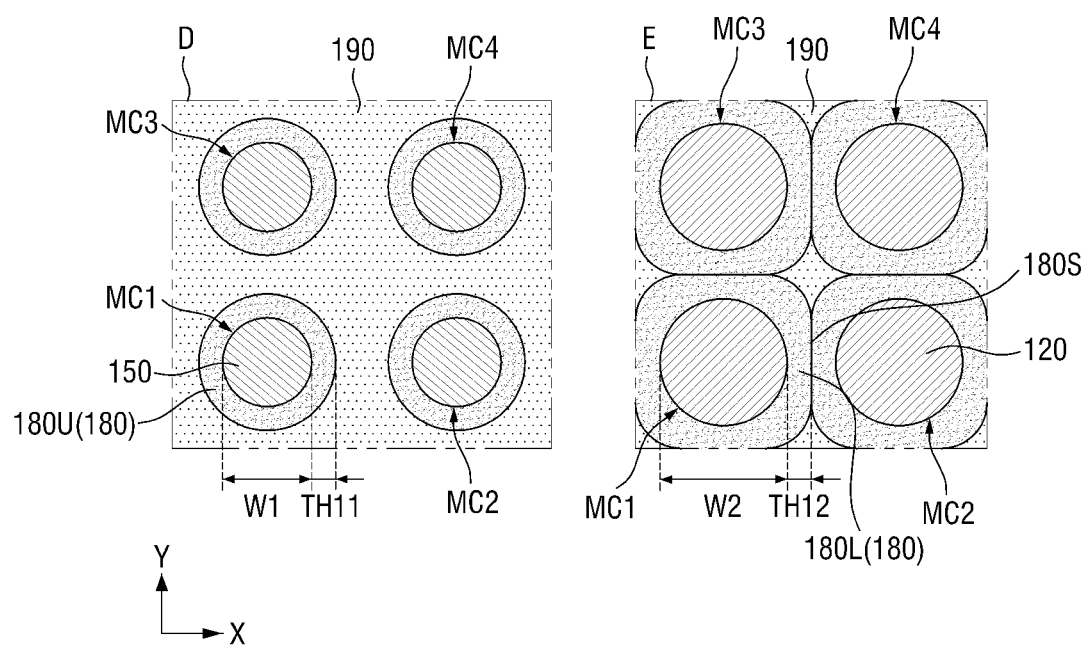
FIGS. 7A, 7B, 7C and 7D are various cross-sectional views taken along lines D-D and E-E of FIGS. 5 and 6.

Here, the first width W1 and the second width W2 mean widths in a direction parallel to the top surface of the substrate 100. For example, as illustrated in FIG. 7A, each of the first width W1 and the second width W2 may be defined as a width in the second direction X.

In some embodiments, the width of the second stack ST2 may be greater than the width of the first stack ST1. For example, as illustrated in FIG. 5, the side surface of the second stack ST2 may protrude from the side surface of the first stack ST1. Accordingly, as illustrated in FIGS. 5 and 7A, the first width W1 of the storage pattern 150 may be smaller than the second width W2 of the selection pattern 120.

In some embodiments, the first stack ST1 may include the lower electrode pattern 110, the selection pattern 120, and the middle electrode pattern 130, and the second stack ST2 may include the first barrier pattern 140, the storage pattern 150, the second barrier pattern 160, and the upper electrode pattern 170. In this case, a part of the top surface of the middle electrode pattern 130 may be exposed from the second stack ST2.

In some embodiments, the passivation layer 180 may conformally extend along the side surface of each of the memory cells MC1 to MC4. For example, the passivation layer 180 may conformally extend along the side surface of the first stack ST1 and the side surface of the second stack ST2.

In some embodiments, the first thickness TH11 of the upper portion 180U of the passivation layer 180 may be equal to or greater than the second thickness TH12 of the lower portion 180L of the passivation layer 180. As an example, when the distance between the first stack ST1 of the first memory cell MC1 and the first stack ST1 of the second memory cell MC2 is the same as twice the first thickness TH11, the first thickness TH11 of the upper portion 180U of the passivation layer 180 may be the same as the second thickness TH12 of the lower portion 180L of the passivation layer 180. As another example, when the distance between the first stack ST1 of the first memory cell MC1 and the first stack ST1 of the second memory cell MC2 is smaller than twice the first thickness TH11, the first thickness TH11 of the upper portion 180U of the passivation layer 180 may be greater than the second thickness TH12 of the lower portion 180L of the passivation layer 180.

Referring to FIGS. 6 and 7A, in the semiconductor memory device according to some embodiments, each of the width of the first stack ST1 and the width of the second stack ST2 decreases as moving away from the top surface of the substrate 100.

For example, each of the width of the first memory cell MC1 and the width of the second memory cell MC2 may decrease as moving away from the top surface of the substrate 100. Accordingly, as illustrated in FIGS. 6 and 7A, the first width W1 of the storage pattern 150 may be smaller than the second width W2 of the selection pattern 120.

Although it is illustrated only that the width of the top surface of the first stack ST1 is the same as the width of the bottom surface of the second stack ST2, this is merely an example. For example, the width of the top surface of the first stack ST1 may be smaller than or larger than the width of the bottom surface of the second stack ST2.

In some embodiments, the passivation layer 180 may conformally extend along the side surface of each of the memory cells MC1 to MC4. For example, the passivation layer 180 may conformally extend along the side surface of the first memory cell MC1 and the side surface of the second memory cell MC2.

Figure 7B:
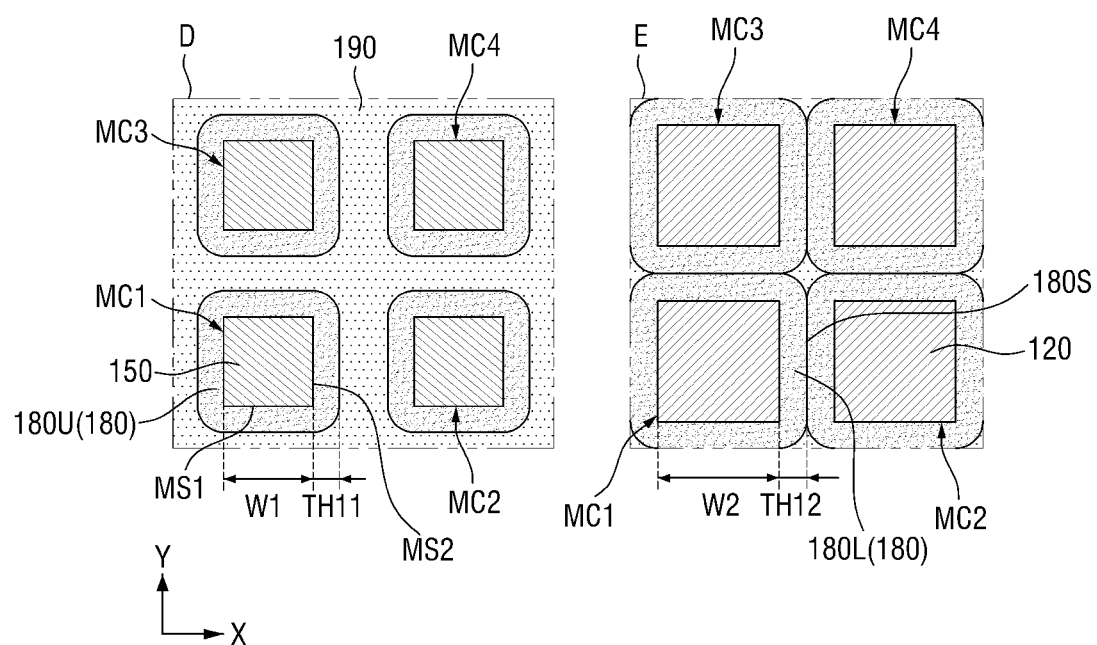

Referring to FIGS. 5, 6, and 7B, in the semiconductor memory device according to some embodiments, each of the memory cells MC1 to MC4 has a rectangular column shape.

For example, each of the memory cells MC1 to MC4 may include the first side surface MS1 extending in the second direction X and the second side surface MS2 extending in the first direction Y.

As described above, the upper portion 180U of the passivation layer 180 may surround the storage pattern 150, and the lower portion 180L of the passivation layer 180 may surround the selection pattern 120. Accordingly, the upper portion 180U of the passivation layer 180 may cover the first side surface MS1 and the second side surface MS2 of the storage pattern 150, and the lower portion 180L of the passivation layer 180 may cover the first side surface MS1 and the second side surface MS2 of the selection pattern 120.

Figure 7C:
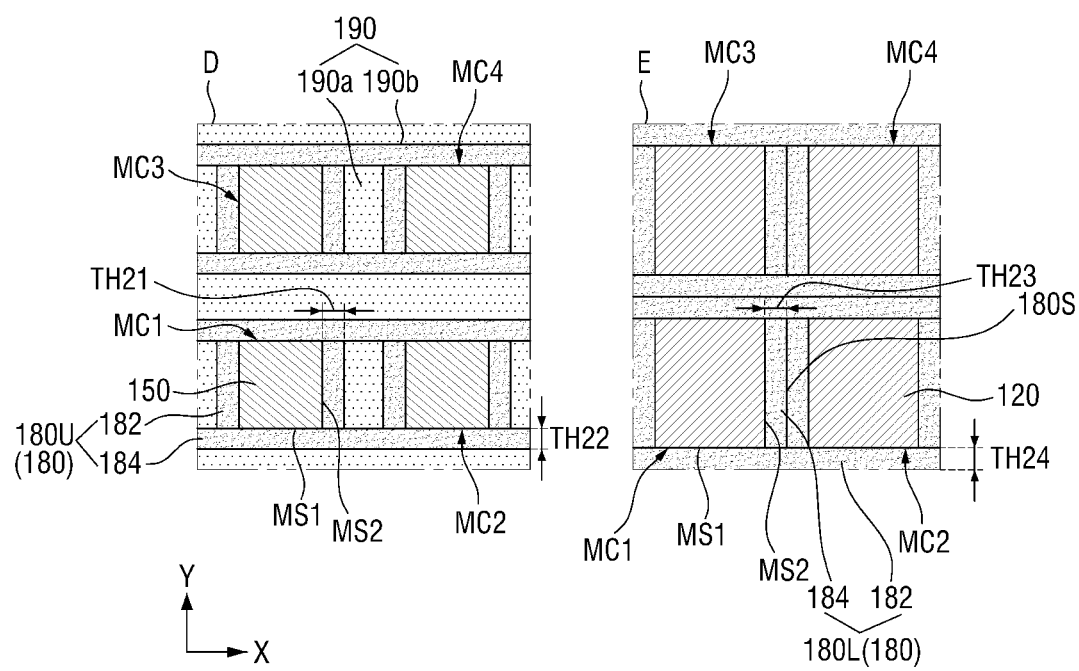

Referring to FIGS. 5, 6, and 7C, in the semiconductor memory device according to example embodiments, the passivation layer 180 includes the first layer 182 and the second layer 184.

In some embodiments, the third thickness TH21 of the upper portion 180U of the first layer 182 may be equal to or greater than the fifth thickness TH23 of the lower portion 180L of the first layer 182. In addition, in some embodiments, the fourth thickness TH22 of the upper portion 180U of the second layer 184 may be equal to or greater than the sixth thickness TH24 of the lower portion 180L of the second layer 184.

Figure 7D:
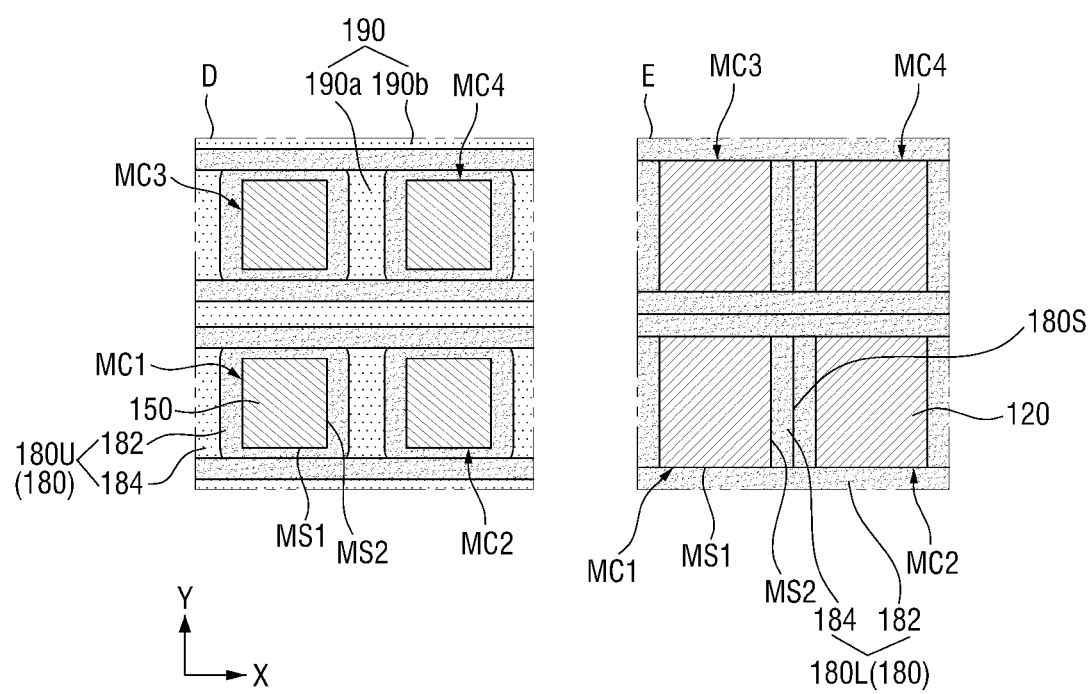

Referring to FIGS. 5, 6, and 7D, in the semiconductor memory device according to example embodiments, the first layer 182 covers the first side surface MS1 and the second side surface MS2 of the storage pattern 150.

For example, the first layer 182 may surround the storage pattern 150. In some embodiments, the second layer 184 may be spaced apart from the storage pattern 150 by the first layer 182. For example, the second layer 184 may be elongated in the second direction X to cover the side surface of the upper portion 180U of the first layer 182.

In some embodiments, the first layer 182 may not cover the first side surface MS1 of the selection pattern 120. For example, the second layer 184 may be elongated in the second direction X to cover the second side surface MS2 of the selection pattern 120 and the side surface of the lower portion 180L of the first layer 182.

In the semiconductor memory device according to some embodiments, the passivation layer 180 may fill a space between the memory cells MC1 to MC4 in an area in which the selection pattern 120 is formed, and may provide a space for forming the gap fill layer 190 in an area in which the storage pattern 150 is formed. For example, as described above, the first width W1 of the storage pattern 150 may be smaller than the second width W2 of the selection pattern 120. Accordingly, dispersion and deterioration of characteristics of the selection pattern 120 may be prevented and interference between the storage patterns 150 may be prevented, and thus a semiconductor memory device with improved performance and reliability may be provided.

Hereinafter, a method for fabricating a semiconductor memory device according to example embodiments will be described with reference to FIGS. 1 to 39.

FIGS. 8, 9, 10, 11, 12, 13, 14, 15, 16 and 17 are diagrams illustrating the intermediate steps of a method for fabricating a semiconductor memory device according to example embodiments. For simplicity of description, redundant parts of the description made with reference to FIGS. 1 to 7 may be recapitulated or omitted.

Figure 8:
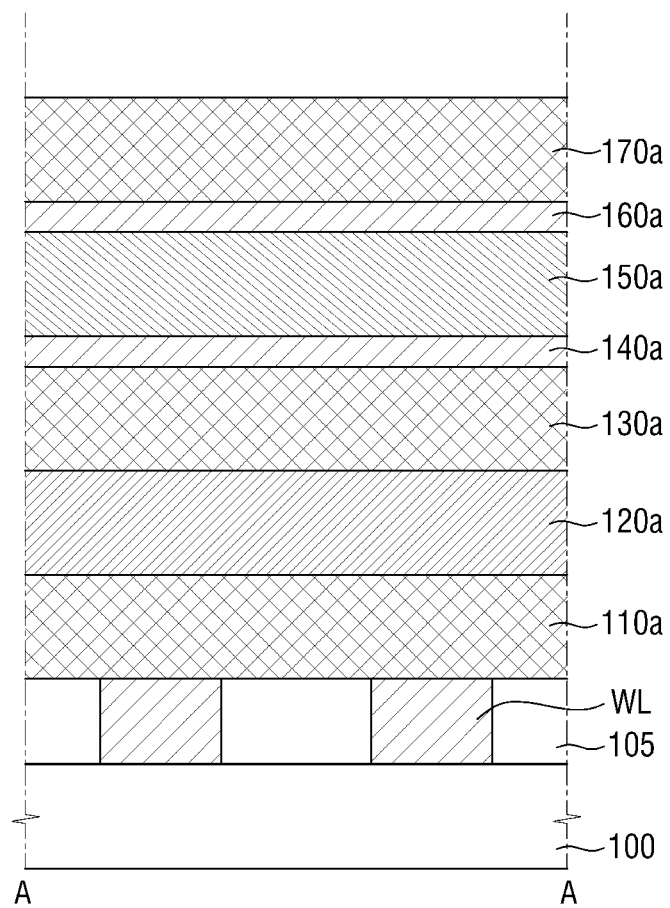
FIGS. 8, 9, 10, 11, 12, 13, 14, 15, 16 and 17 are diagrams illustrating the intermediate steps of a method for fabricating a semiconductor memory device according to example embodiments.

Referring to FIG. 8, a lower electrode layer 110a, a selection layer 120a, a middle electrode layer 130a, a storage layer 150a, and an upper electrode layer 170a are sequentially formed on the substrate 100.

In some embodiments, the first conductive line WL and the interlayer insulating layer 105 may be formed on the substrate 100. A plurality of first conductive lines WL may be spaced apart from each other and extend side by side. For example, each of the first conductive lines WL may extend in the first direction Y. The interlayer insulating layer 105 may electrically separate the plurality of first conductive lines WL. The lower electrode layer 110a may be stacked to be electrically connected to the first conductive line WL. For example, the lower electrode layer 110a may extend along the top surface of the first conductive line WL and the top surface of the interlayer insulating layer 105.

However, the technical spirit of the disclosure is not limited thereto, and the first conductive line WL may be formed by patterning at the same time as the first stack ST1 to be described later. For example, the first conductive line WL may be patterned in the step of FIG. 12 to be described later.

The lower electrode layer 110a and the upper electrode layer 170a may each include, for example, any one or any combination a metal such as tungsten (W), platinum (Pt), palladium (Pd), rhodium (Rh), ruthenium (Ru), iridium (Ir), copper (Cu), aluminum (Al), titanium (Ti), tantalum (Ta), a metal nitride such as titanium nitride (TiN), or a combination thereof, but is not limited thereto. In some embodiments, the lower electrode layer 110a and the upper electrode layer 170a may each include a carbon (C) layer.

The selection layer 120a may have ovonic threshold switching (OTS) characteristics. The selection layer 120a may include, for example, a chalcogenide material.

The middle electrode layer 130a may include, for example, metal nitride or metal silicon nitride such as titanium nitride (TiN), titanium silicon nitride (TiSiN), tungsten nitride (WN), tungsten silicon nitride (WSiN), tantalum nitride (TaN), tantalum silicon nitride (TaSiN), zirconium nitride (ZrN), and zirconium silicon nitride (ZrSiN), but is not limited thereto. In some embodiments, the middle electrode layer 130a may include a carbon (C) layer.

The storage layer 150a may include a material of which resistance changes according to a temperature change. The storage layer 150a may include, for example, a compound that is formed by a combination of any one or any combination Te and Se, which are chalcogen elements, and any one or any combination Ge, Sb, Bi, Pb, Sn, Ag, As, S, Si, In, Ti, Ga, P, O, or C. In embodiments, the storage pattern 150 may include GeSbTe (GST).

In some embodiments, a first barrier layer 140a may be formed between the middle electrode layer 130a and the storage layer 150a. The first barrier layer 140a may include, for example, tungsten (W), but is not limited thereto.

In some embodiments, a second barrier layer 160a may be formed between the storage layer 150a and the upper electrode layer 170a. The second barrier layer 160a may include, for example, tungsten (W), but is not limited thereto.

Figure 9:
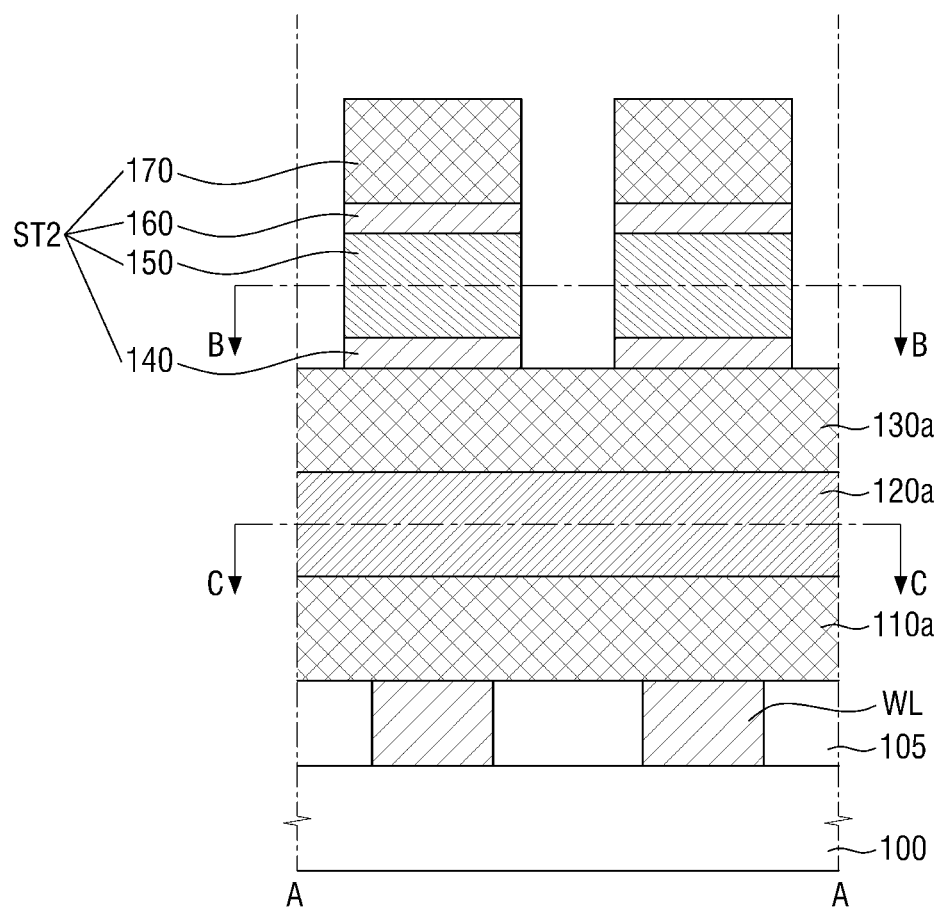
Figure 10:
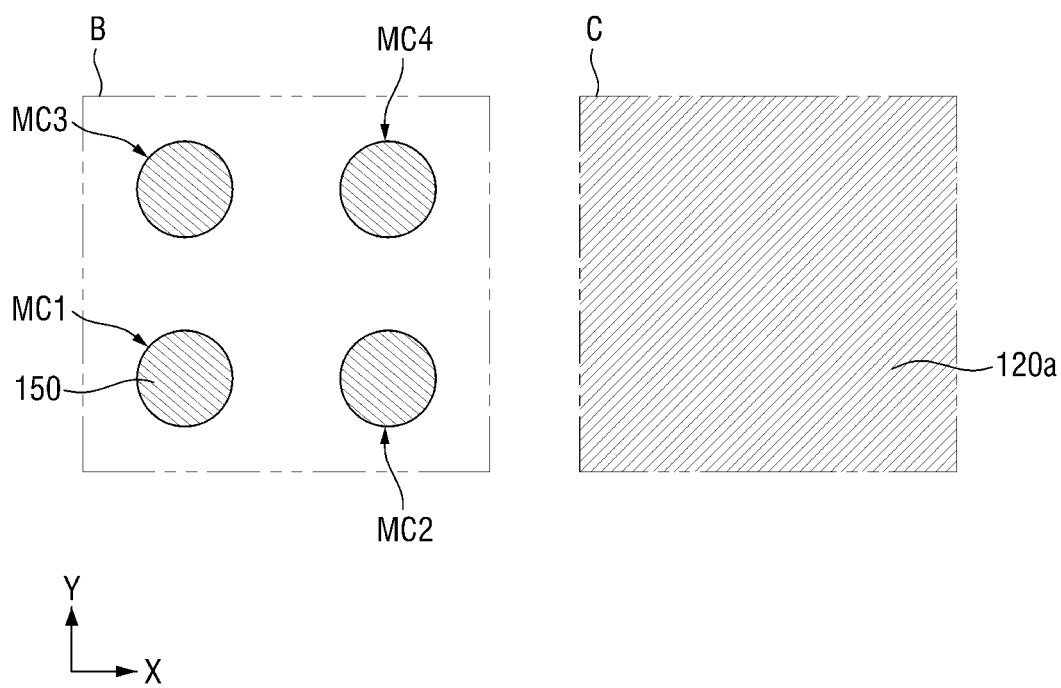

Referring to FIGS. 9 and 10, the first barrier layer 140a, the storage layer 150a, the second barrier layer 160a, and the upper electrode layer 170a are patterned.

Accordingly, the second stack ST2 including the first barrier pattern 140, the storage pattern 150, the second barrier pattern 160, and the upper electrode pattern 170 may be formed. In some embodiments, the second stack ST2 may form a plurality of isolated areas spaced apart from each other.

The second stack ST2 is illustrated to have a cylindrical shape, but this is only an example. For example, it goes without saying that the second stack ST2 may have various other shapes such as a rectangular column.

Figure 11:
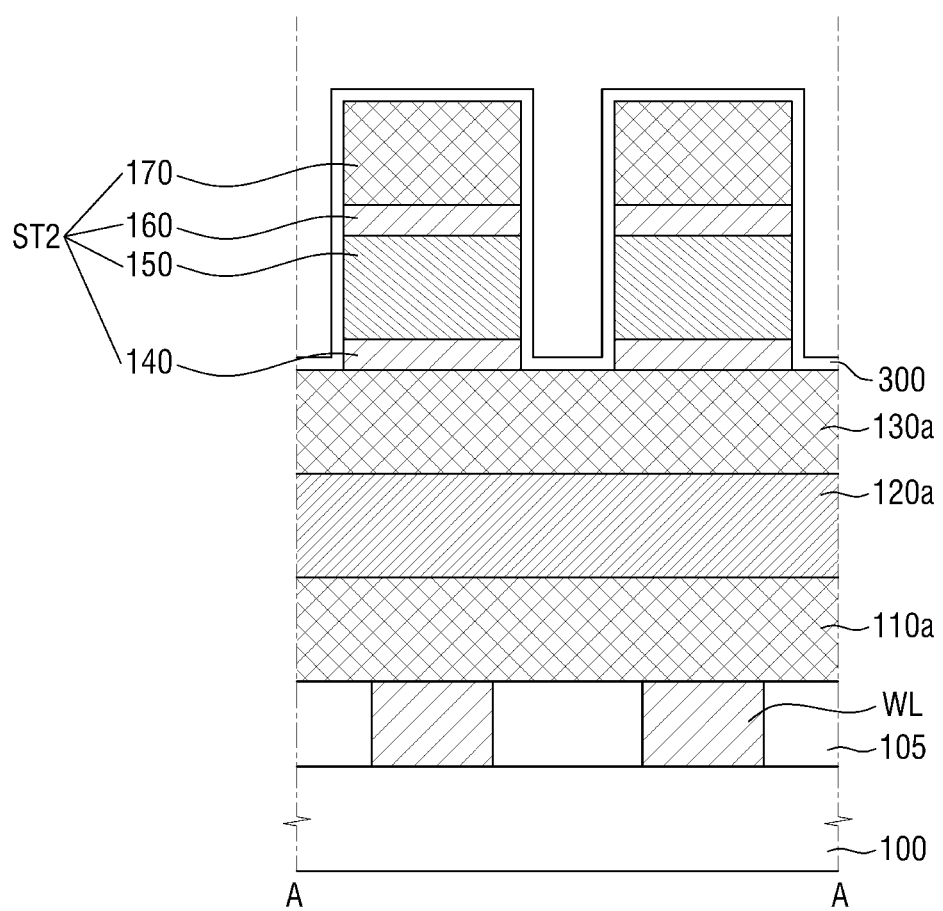

Referring to FIG. 11, a spacer layer 300 is formed on the second stack ST2.

For example, the spacer layer 300 may conformally extend along the side surface and the top surface of the second stack ST2 and the top surface of the middle electrode layer 130a. The spacer layer 300 may protect the second stack ST2 in the process of forming the first stack ST1 to be described later.

Figure 12:
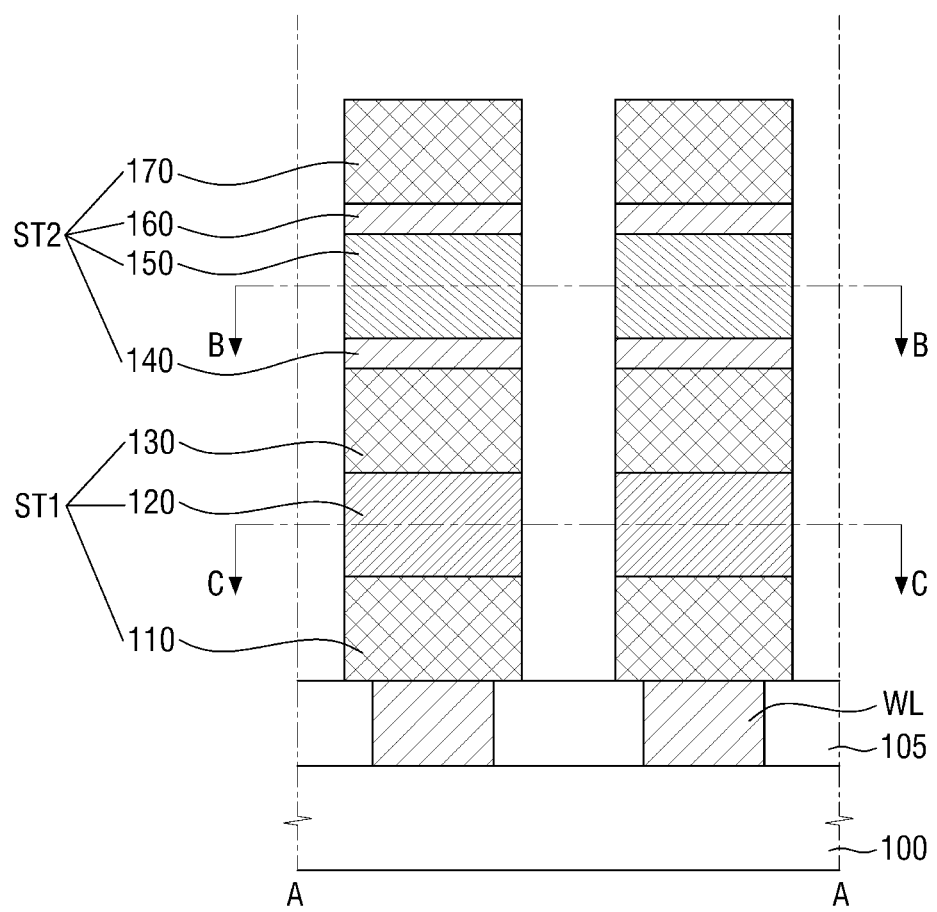
Figure 13:
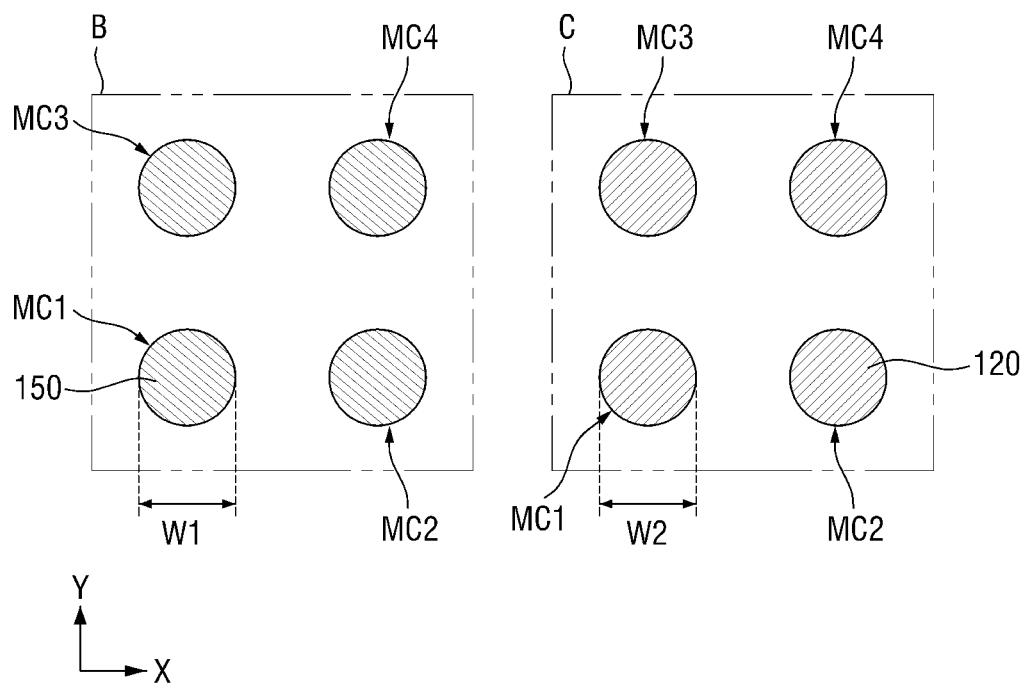

Referring to FIGS. 12 and 13, the lower electrode layer 110a, the selection layer 120a, and the middle electrode layer 130a are patterned using the spacer layer 300.

Accordingly, the first stack ST1 including the lower electrode pattern 110, the selection pattern 120, and the middle electrode pattern 130 may be formed. In addition, a plurality of memory cells MC1 to MC4 including the first stack ST1 and the second stack ST2 may be formed.

Each of the memory cells MC1 to MC4 is illustrated to have a cylindrical shape, but this is only an example. For example, it goes without saying that each of the memory cells MC1 to MC4 may have various shapes such as a rectangular column.

In embodiments, the first width W1 of the storage pattern 150 may be the same as the second width W2 of the selection pattern 120.

Figure 14:
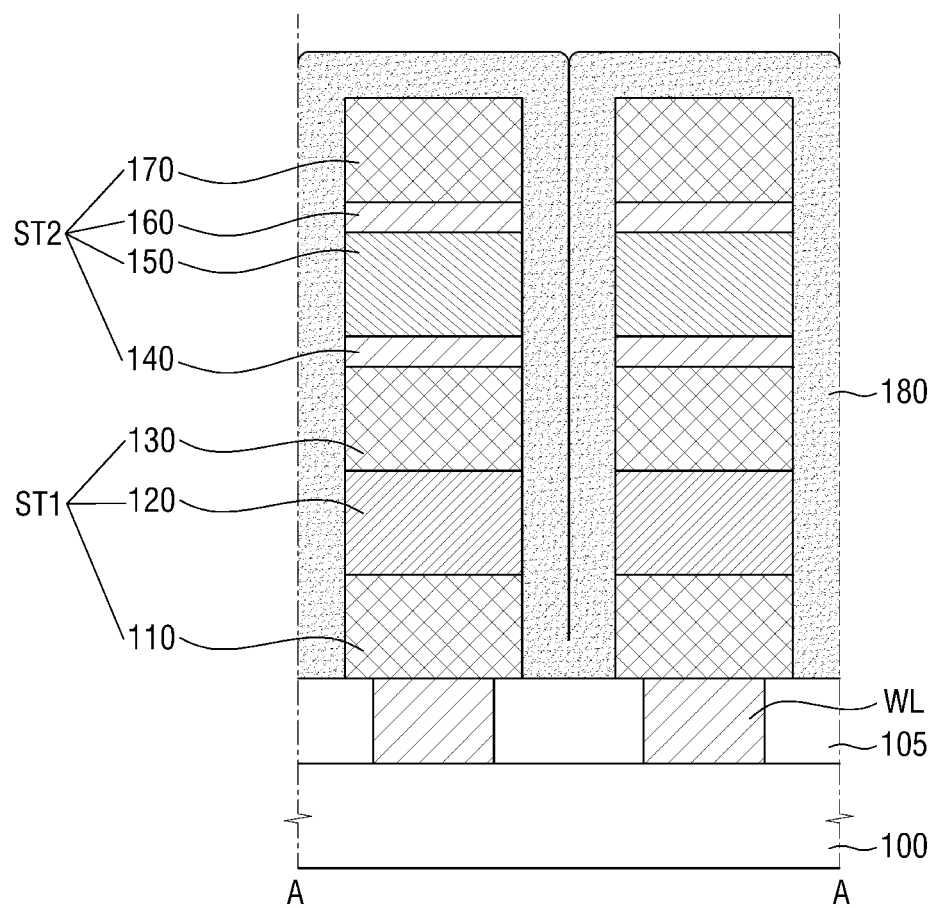

Referring to FIG. 14, the passivation layer 180 is formed on the memory cells MC1 to MC4.

For example, the passivation layer 180 may extend along the side surface of the first memory cell MC1, the side surface of the second memory cell MC2, and the top surface of the interlayer insulating layer 105. In addition, the passivation layer 180 may surround the side surface of each of the memory cells MC1 to MC4.

In some embodiments, the passivation layer 180 may be formed to fill a space between the memory cells MC1 to MC4 adjacent to each other. For example, the passivation layer 180 may be formed to fill a space between the first memory cell MC1 and the second memory cell MC2.

In some embodiments, the passivation layer 180 may extend conformally. In some embodiments, the passivation layer 180 may include the seam 180S.

The passivation layer 180 may include, for example, any one or any combination silicon oxide, aluminum oxide, silicon nitride, silicon oxynitride, silicon carbide, silicon carbonitride, silicon oxycarbonitride, or a combination thereof, but is not limited thereto.

Although only a single layer of the passivation layer 180 is illustrated, this is only an example. For example, it goes without saying that the passivation layer 180 may be a multilayer stacked on the memory cells MC1 to MC4.

Figure 15:
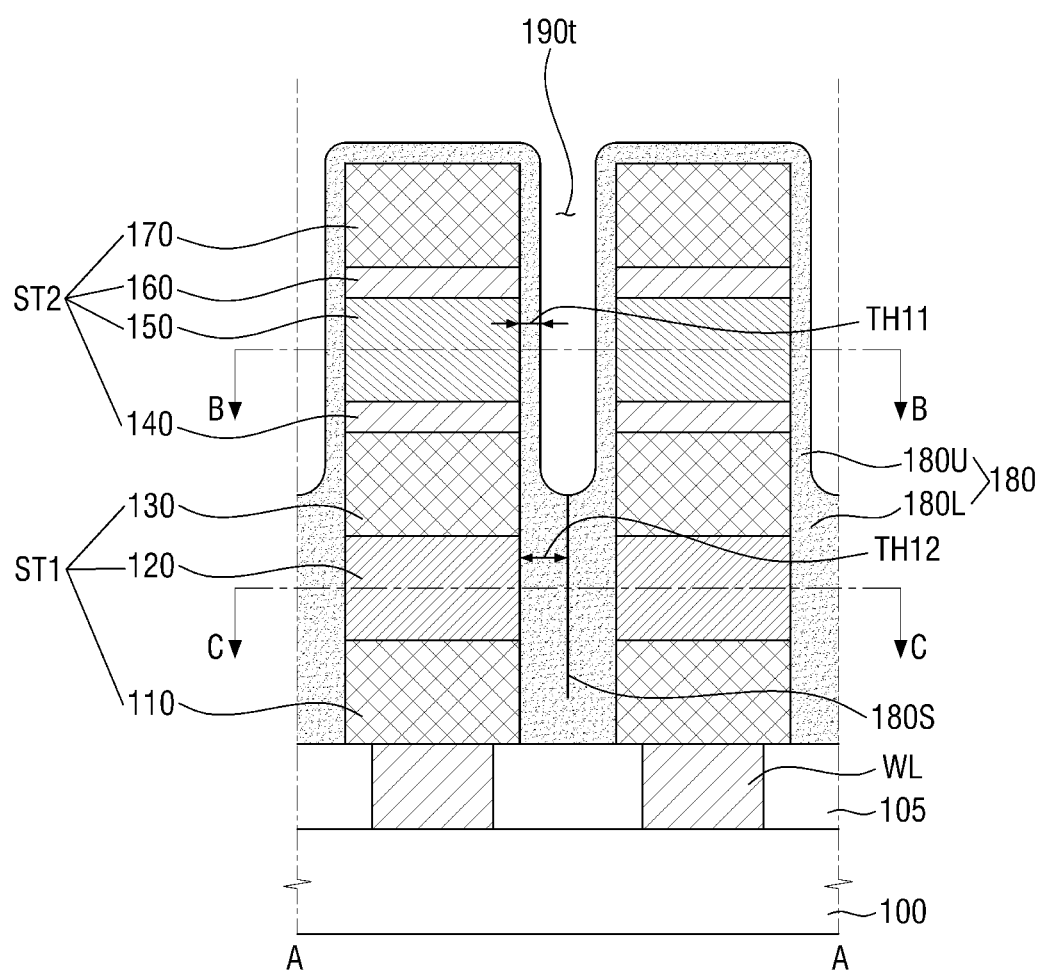
Figure 16:
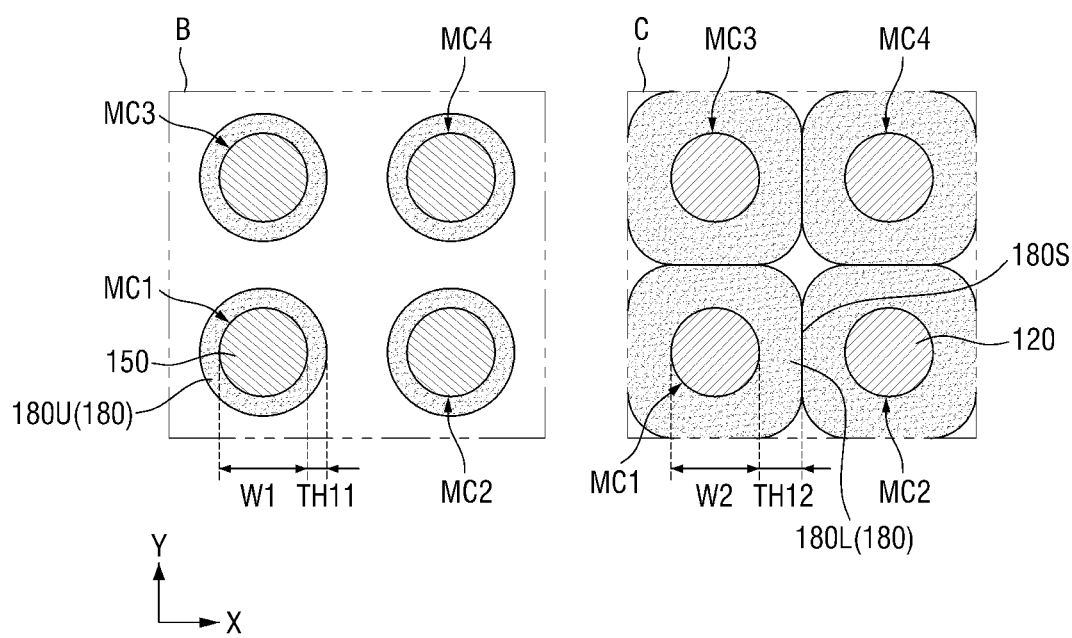

Referring to FIGS. 15 and 16, the recess 190t is formed in the passivation layer 180.

For example, an etchback process or a recess process may be performed on the passivation layer 180. In some embodiments, the bottom surface of the recess 190t may be formed lower than the bottom surface of the storage pattern 150 and higher than the top surface of the selection pattern 120.

The recess 190t may not expose the side surface of the storage pattern 150. For example, the recess 190t may not expose the side surface of the second stack ST2. Accordingly, the passivation layer 180 including the lower portion 180L and the upper portion 180U may be formed. The lower portion 180L of the passivation layer 180 may cover the side surface of the selection pattern 120, and the upper portion 180U of the passivation layer 180 may cover the side surface of the storage pattern 150. In addition, the first thickness TH11 of the upper portion 180U of the passivation layer 180 may be less than the second thickness TH12 of the lower portion 180L of the passivation layer 180.

Figure 17:
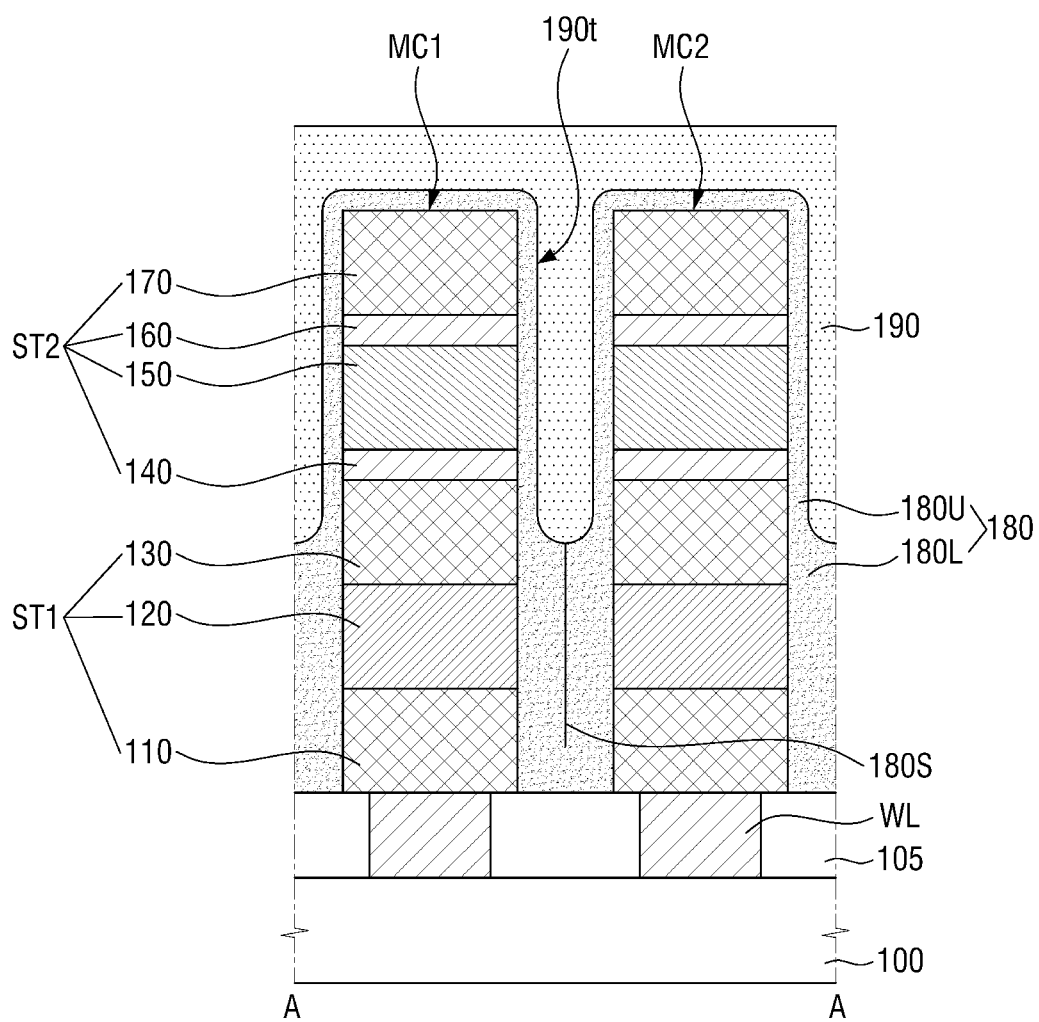

Referring to FIG. 17, the gap fill layer 190 is formed on the passivation layer 180.

The gap fill layer 190 may cover the passivation layer 180. The gap fill layer 190 may fill a space between the storage patterns 150 of the memory cells MC1 to MC4 adjacent to each other. For example, the gap fill layer 190 may be interposed between the storage pattern 150 of the first memory cell MC1 and the storage pattern 150 of the second memory cell MC2. The gap fill layer 190 may not be interposed between the selection patterns 120 of the memory cells MC1 to MC4 adjacent to each other. For example, the gap fill layer 190 may not be interposed between the selection pattern 120 of the first memory cell MC1 and the selection pattern 120 of the second memory cell MC2.

The gap fill layer 190 may include a material having a lower thermal conductivity than the passivation layer 180. For example, the gap fill layer 190 may include any one or any combination silicon oxide, silicon oxycarbide, or a low thermal conductivity material having a lower thermal conductivity than silicon oxide.

Subsequently, referring to FIGS. 1 to 3B, the second conductive line BL is formed on the memory cells MC1 to MC4.

For example, a planarization process of exposing the top surface of the upper electrode pattern 170 may be performed. The planarization process may include, for example, a chemical mechanical polishing (CMP) process, but is not limited thereto. Subsequently, the second conductive line BL may be formed on the upper electrode pattern 170, the passivation layer 180, and the gap fill layer 190. Accordingly, the second conductive line BL may be electrically connected to the upper electrode pattern 170.

A plurality of second conductive lines BL may be spaced apart from each other and extend side by side. For example, each of the second conductive lines BL may extend in the second direction X.

Accordingly, a method for fabricating a semiconductor memory device with improved performance and reliability may be provided.

Figure 18:
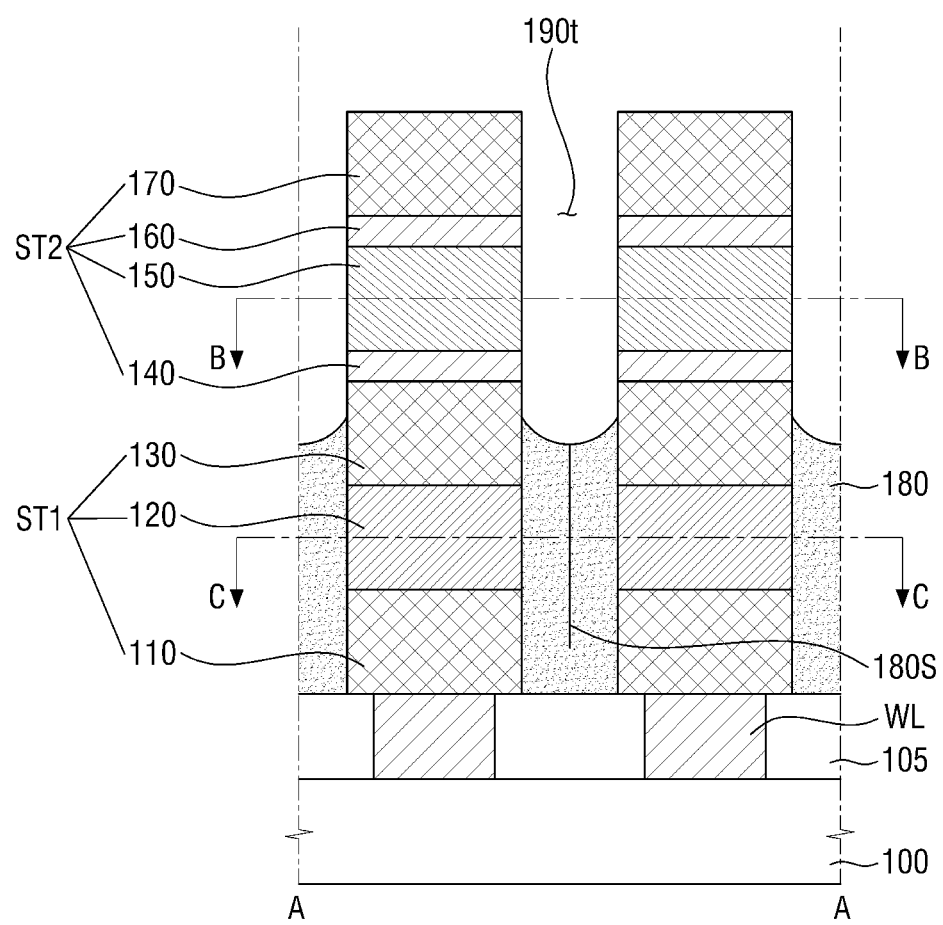
FIGS. 18 and 19 are views illustrating the intermediate steps for explaining a method for fabricating a semiconductor memory device according to example embodiments.
Figure 19:
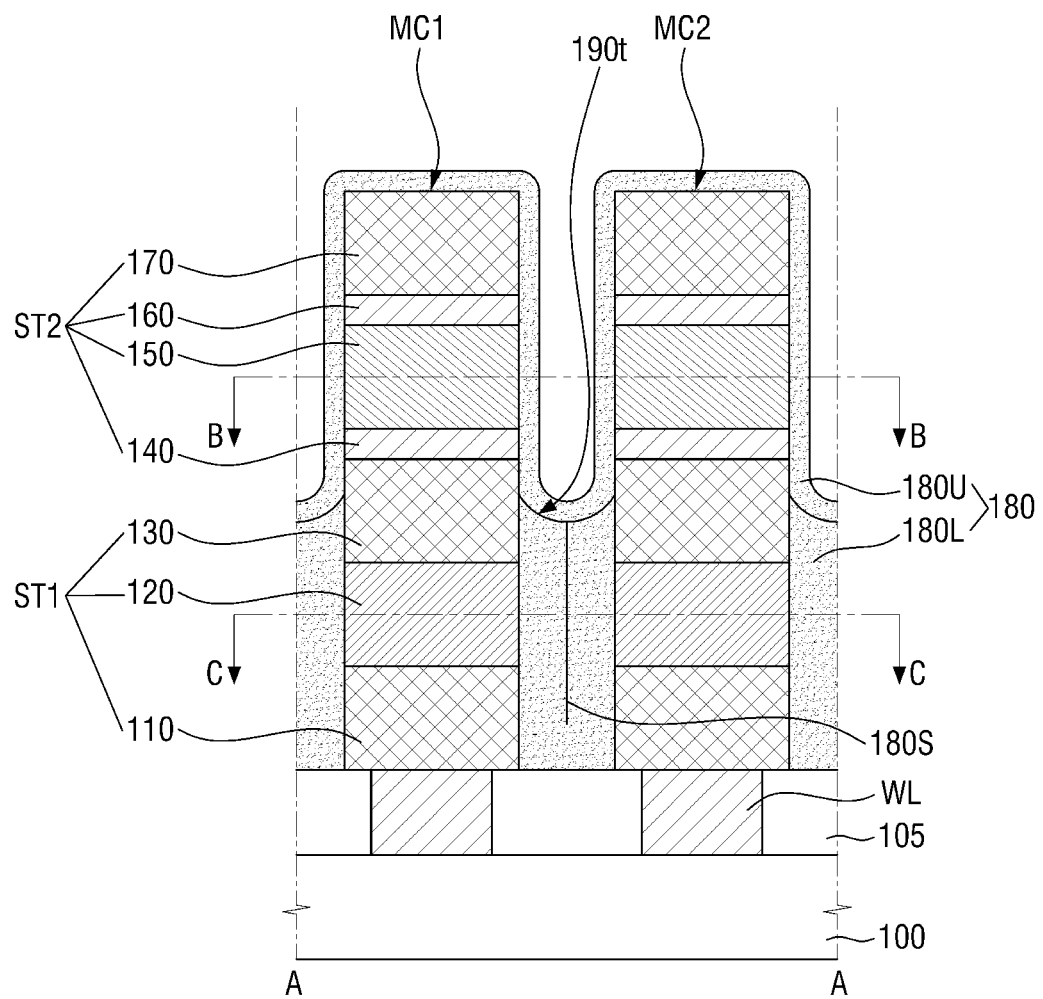

FIGS. 18 and 19 are views illustrating the intermediate steps for explaining a method for fabricating a semiconductor memory device according to example embodiments. For simplicity of description, redundant parts of the description made with reference to FIGS. 1 to 17 may be recapitulated or omitted. For reference, FIG. 18 is a diagram for describing the steps after FIG. 14.

Referring to FIG. 18, the recess 190t is formed in the passivation layer 180.

The recess 190t may expose the side surface of the storage pattern 150. For example, the recess 190t may expose the side surface of the second stack ST2. Accordingly, the lower portion 180L of the passivation layer 180 may be formed. The lower portion 180L of the passivation layer 180 may cover the side surface of the selection pattern 120.

Referring to FIG. 19, the upper portion 180U of the passivation layer 180 is formed on the lower portion 180L of the passivation layer 180.

The upper portion 180U of the passivation layer 180 may extend along the side surface and the bottom surface of the recess 190t. Accordingly, the upper portion 180U of the passivation layer 180 may extend along the side surface of the second stack ST2 and the top surface of the lower portion 180L of the passivation layer 180. In some embodiments, the upper portion 180U of the passivation layer 180 may conformally extend along the side surface of the second stack ST2 and the top surface of the lower portion 180L of the passivation layer 180.

Subsequently, the gap fill layer 190 is formed on the passivation layer 180. The formation of the gap fill layer 190 is similar to that described above with reference to FIG. 17, and thus a detailed description will be omitted below.

Subsequently, referring to FIGS. 1 and 4C, the second conductive line BL is formed on the memory cells MC1 to MC4. The formation of the second conductive line BL is similar to that described above with reference to FIGS. 1 to 3B, and thus a detailed description will be omitted below.

Accordingly, a method for fabricating a semiconductor memory device with improved performance and reliability may be provided.

Figure 20:
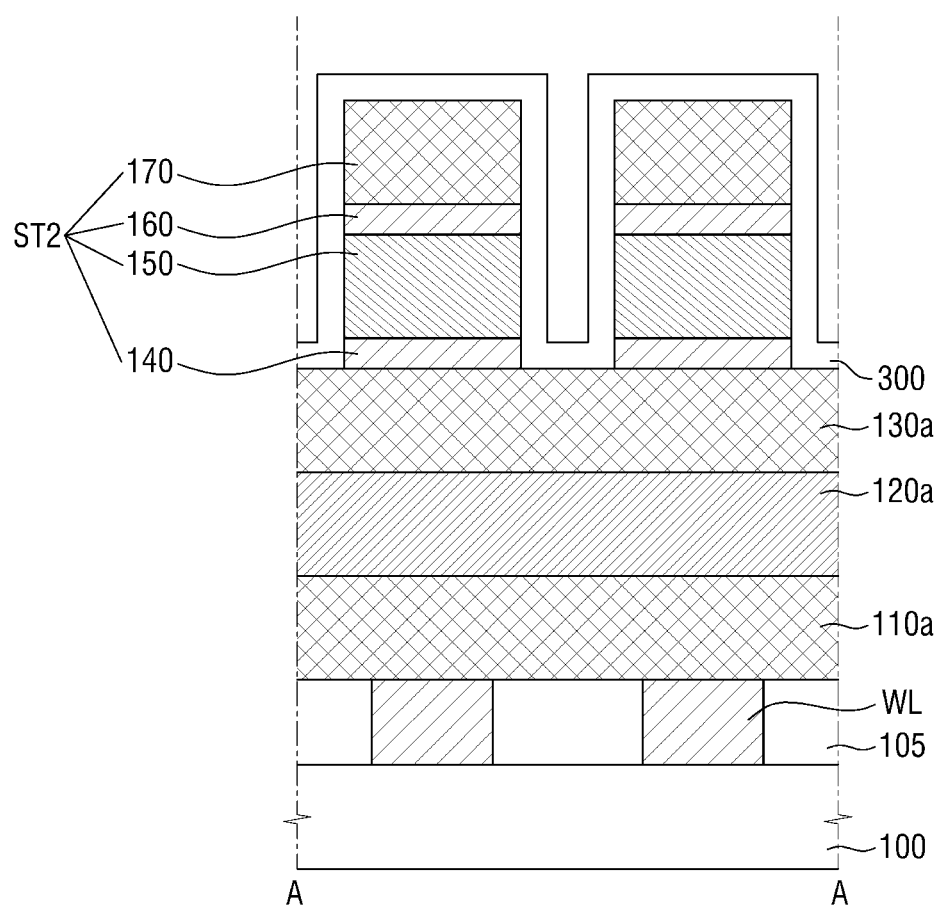
FIGS. 20, 21, 22, 23, 24 and 25 are views illustrating the intermediate steps for explaining a method for fabricating a semiconductor memory device according to example embodiments.

FIGS. 20, 21, 22, 23, 24 and 25 are views illustrating the intermediate steps for explaining a method for fabricating a semiconductor memory device according to example embodiments. For simplicity of description, redundant parts of the description made with reference to FIGS. 1 to 19 may be recapitulated or omitted. For reference, FIG. 20 is a diagram for describing the steps after FIG. 9.

Referring to FIG. 20, the spacer layer 300 is formed on the second stack ST2.

For example, the spacer layer 300 may conformally extend along the side surface and the top surface of the second stack ST2 and the top surface of the middle electrode layer 130a. In some embodiments, the spacer layer 300 may be formed to be relatively thick. For example, the spacer layer 300 of FIG. 20 may be formed thicker than the spacer layer 300 of FIG. 11.

Figure 21:
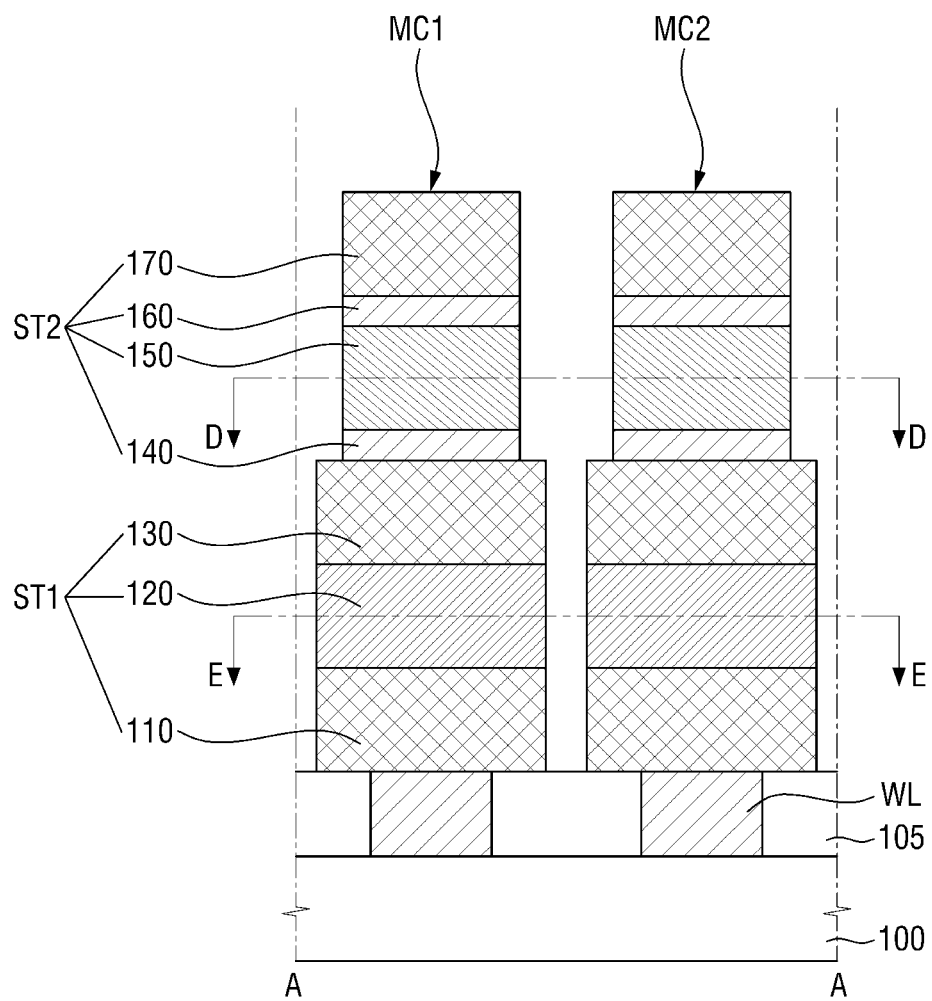
Figure 22:
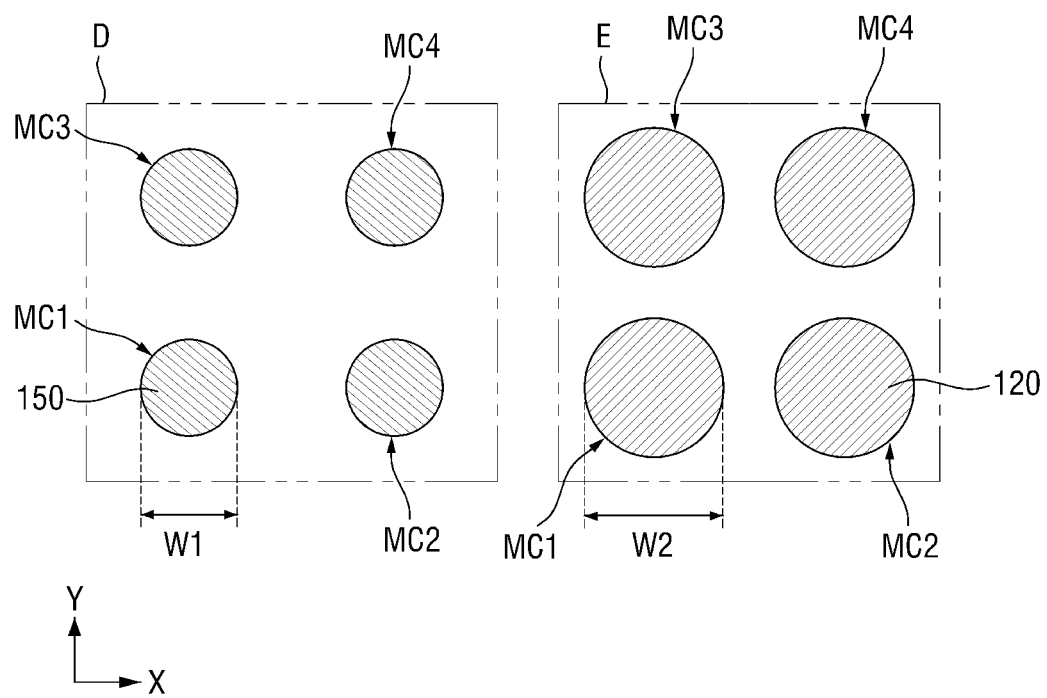

Referring to FIGS. 21 and 22, the lower electrode layer 110a, the selection layer 120a, and the middle electrode layer 130a are patterned using the spacer layer 300.

Accordingly, the first stack ST1 including the lower electrode pattern 110, the selection pattern 120, and the middle electrode pattern 130 may be formed. In addition, a plurality of memory cells MC1 to MC4 including the first stack ST1 and the second stack ST2 may be formed.

In some embodiments, the width of the second stack ST2 may be formed to be greater than the width of the first stack ST1. For example, the side surface of the second stack ST2 may protrude from the side surface of the first stack ST1. This may be due to the fact that the spacer layer 300 is formed relatively thick. Accordingly, the first width W1 of the storage pattern 150 may be smaller than the second width W2 of the selection pattern 120.

Figure 23:
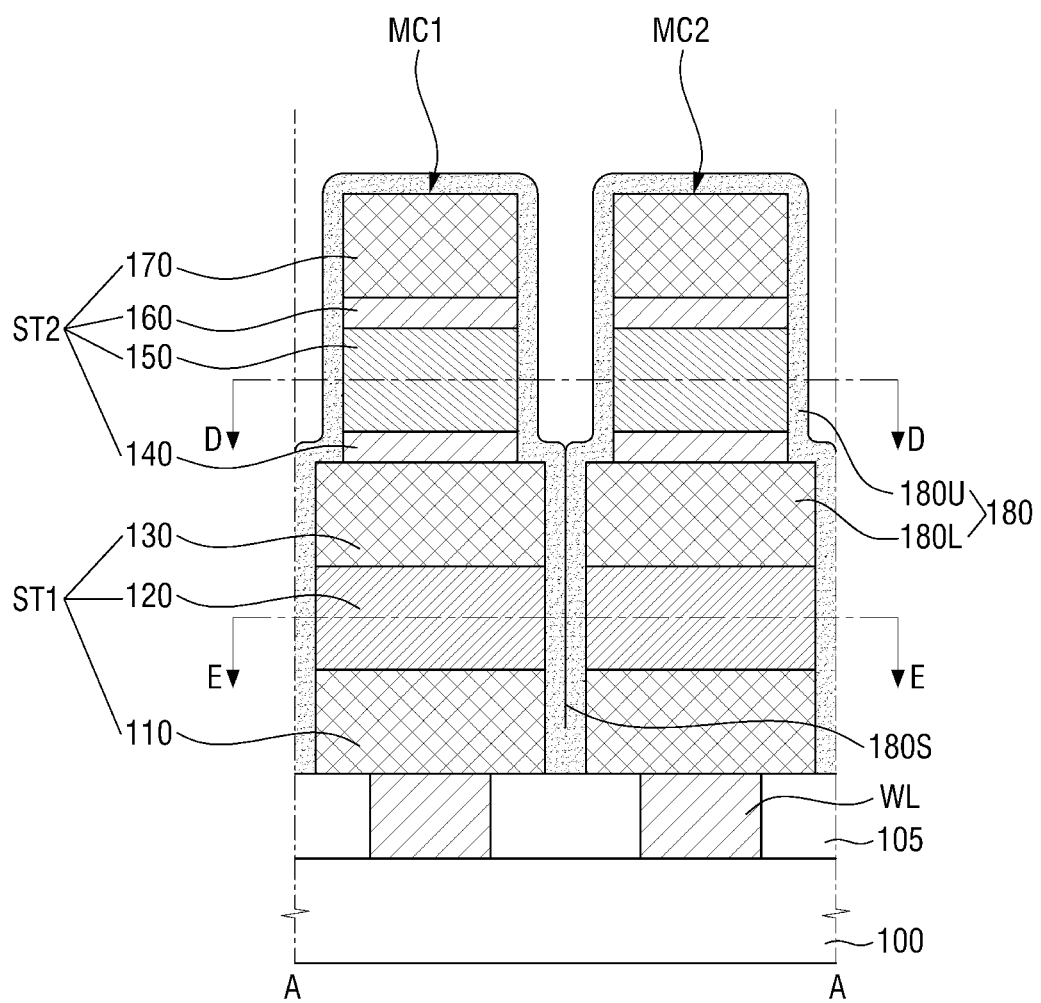
Figure 24:
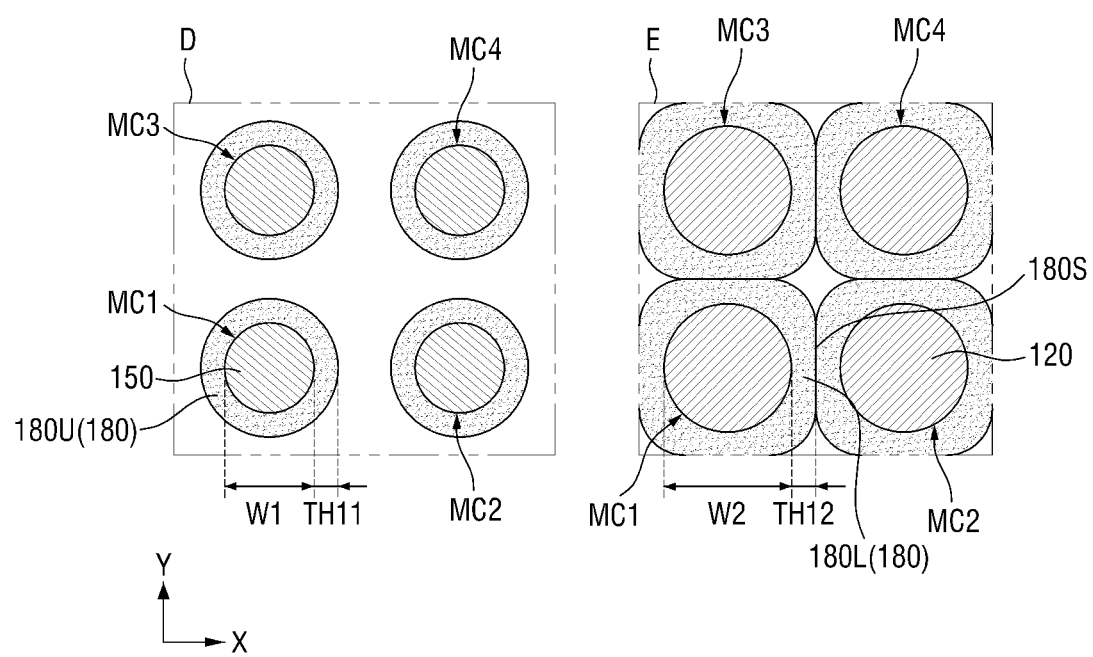

Referring to FIGS. 23 and 24, the passivation layer 180 is formed on the memory cells MC1 to MC4.

For example, the passivation layer 180 may extend along the side surface of the first memory cell MC1, the side surface of the second memory cell MC2, and the top surface of the interlayer insulating layer 105. In addition, the passivation layer 180 may surround the side surface of each of the memory cells MC1 to MC4.

In some embodiments, the passivation layer 180 may be formed to fill the space between the selection patterns 120 of the memory cells MC1 to MC4 adjacent to each other. For example, the passivation layer 180 may be formed to fill a space between the selection pattern 120 of the first memory cell MC1 and the selection pattern 120 of the second memory cell MC2.

Accordingly, the passivation layer 180 including the lower portion 180L and the upper portion 180U may be formed. The lower portion 180L of the passivation layer 180 may cover the side surface of the selection pattern 120, and the upper portion 180U of the passivation layer 180 may cover the side surface of the storage pattern 150. In some embodiments, the first thickness TH11 of the upper portion 180U of the passivation layer 180 may be equal to or greater than the second thickness TH12 of the lower portion 180L of the passivation layer 180.

In some embodiments, the passivation layer 180 may extend conformally. In some embodiments, the passivation layer 180 may include the seam 180S.

Figure 25:
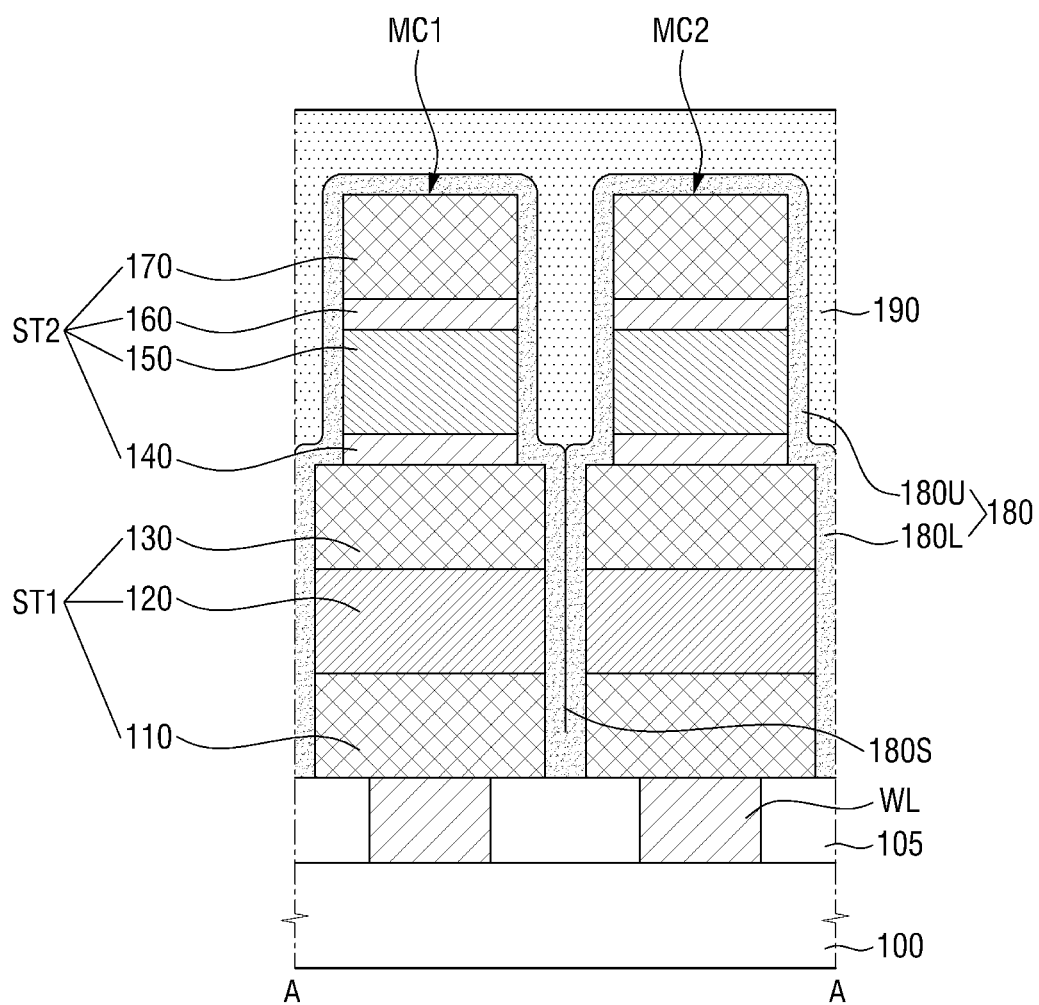

Referring to FIG. 25, the gap fill layer 190 is formed on the passivation layer 180. The formation of the gap fill layer 190 is similar to that described above with reference to FIG. 17, and thus a detailed description will be omitted below.

Subsequently, referring to FIGS. 1, 5, 7A, and 7B, the second conductive line BL is formed on the memory cells MC1 to MC4. The formation of the second conductive line BL is similar to that described above with reference to FIGS. 1 to 3B, and thus a detailed description will be omitted below.

Accordingly, a method for fabricating a semiconductor memory device with improved performance and reliability may be provided.

Figure 26:
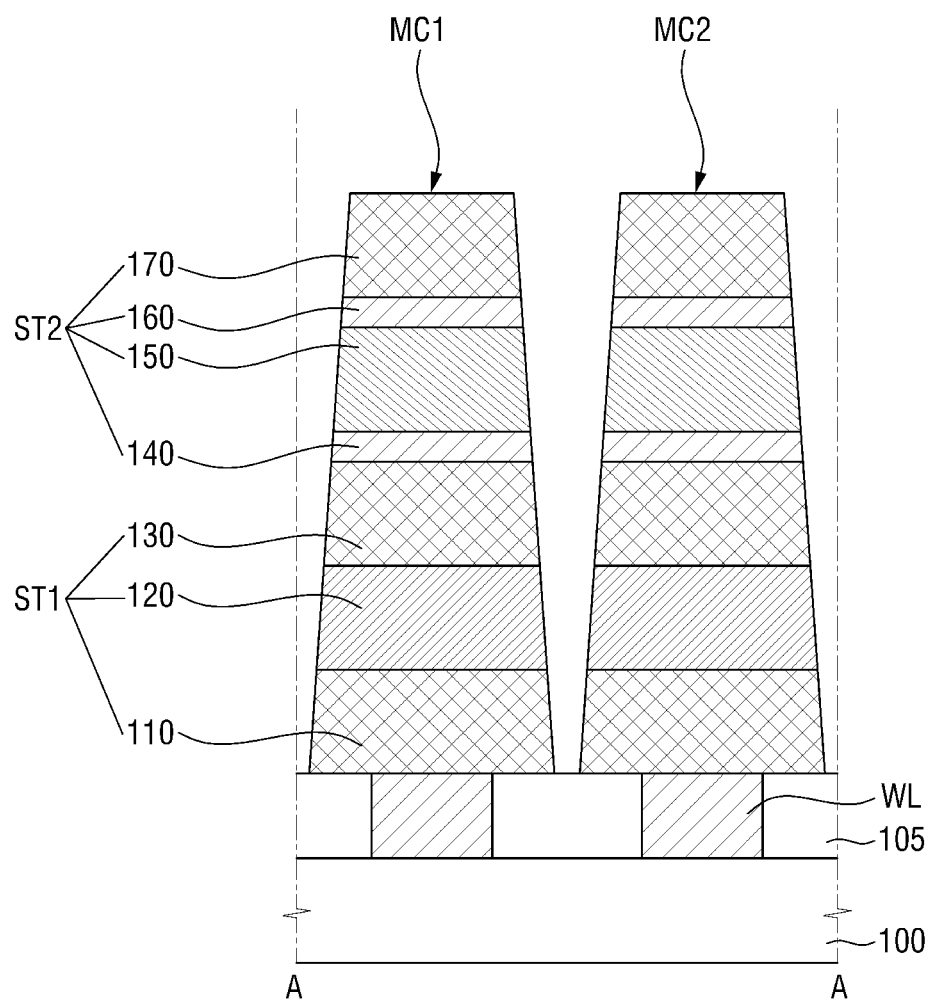
FIGS. 26, 27 and 28 are views illustrating the intermediate steps for explaining a method for fabricating a semiconductor memory device according to example embodiments.
Figure 27:
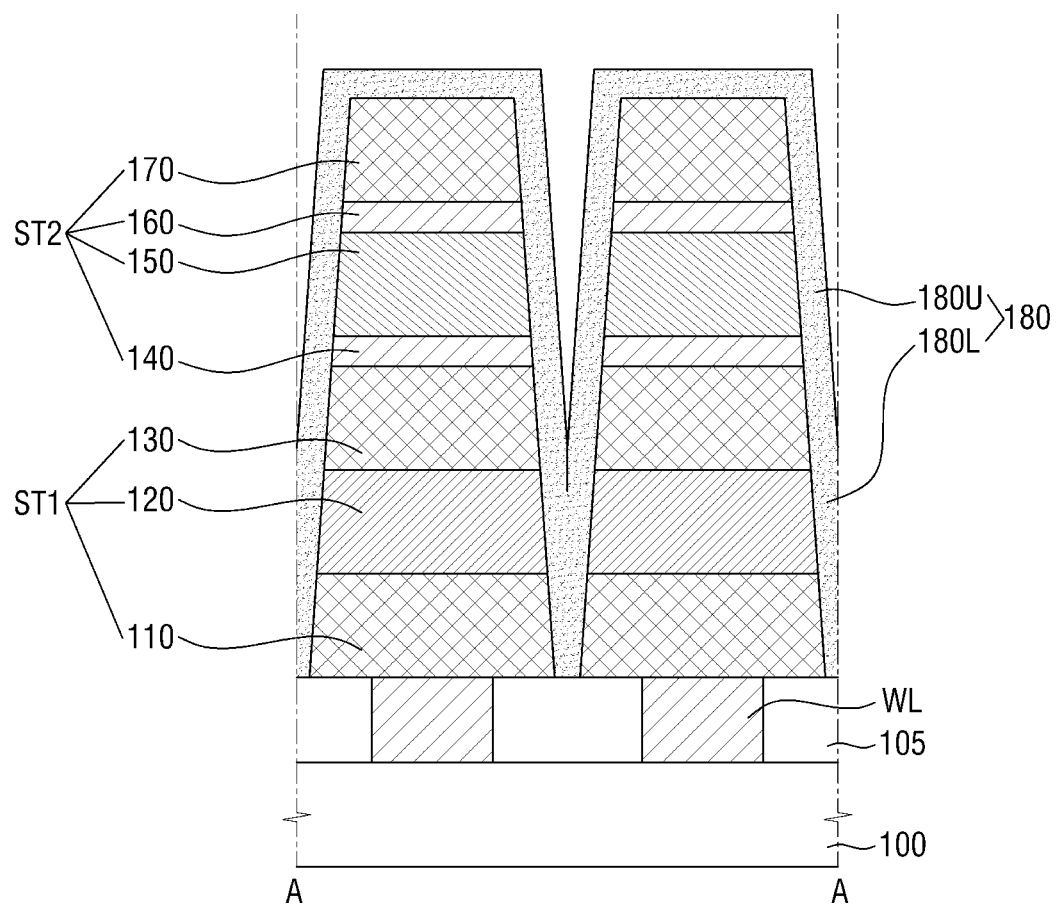
Figure 28:
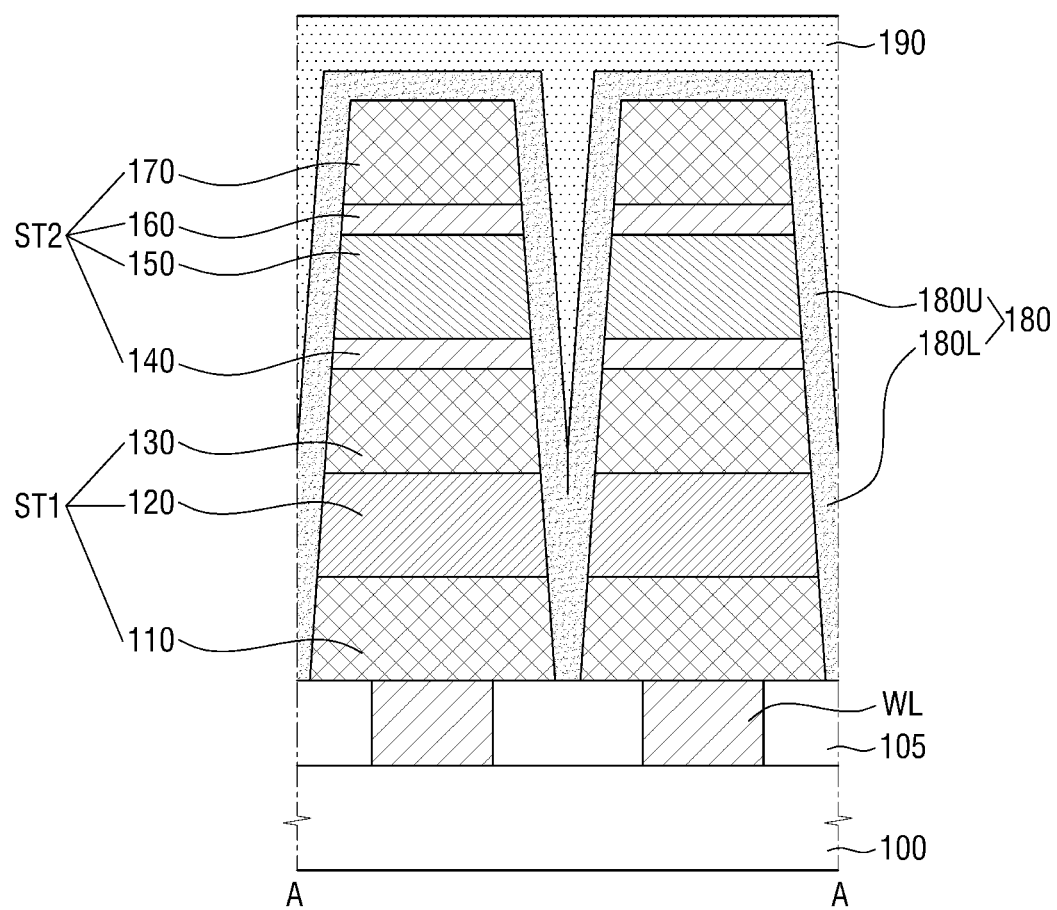

FIGS. 26, 27 and 28 are views illustrating the intermediate steps for explaining a method for fabricating a semiconductor memory device according to some embodiments. For simplicity of description, redundant parts of the description made with reference to FIGS. 1 to 19 may be recapitulated or omitted. For reference, FIG. 26 is a diagram for explaining the steps after FIG. 8 or 11.

Referring to FIG. 26, the lower electrode layer 110a, the selection layer 120a, the middle electrode layer 130a, the first barrier layer 140a, the storage layer 150a, the second barrier layer 160a, and the upper electrode layer 170a are patterned.

Accordingly, a plurality of memory cells MC1 to MC4 including the first stack ST1 and the second stack ST2 may be formed.

In some embodiments, each of the width of the first stack ST1 and the width of the second stack ST2 may be formed to decrease as moving away from the top surface of the substrate 100. For example, each of the width of the first memory cell MC1 and the width of the second memory cell MC2 may be formed to decrease as moving away from the top surface of the substrate 100. The first stack ST1 may be formed simultaneously with the second stack ST2, or may be formed after the second stack ST2 is formed.

Referring to FIG. 27, the passivation layer 180 is formed on the memory cells MC1 to MC4.

For example, the passivation layer 180 may extend along the side surface of the first memory cell MC1, the side surface of the second memory cell MC2, and the top surface of the interlayer insulating layer 105. In addition, the passivation layer 180 may surround the side surface of each of the memory cells MC1 to MC4.

In some embodiments, the passivation layer 180 may be formed to fill the space between the selection patterns 120 of the memory cells MC1 to MC4 adjacent to each other. For example, the passivation layer 180 may be formed to fill a space between the selection pattern 120 of the first memory cell MC1 and the selection pattern 120 of the second memory cell MC2.

Accordingly, the passivation layer 180 including the lower portion 180L and the upper portion 180U may be formed. The lower portion 180L of the passivation layer 180 may cover the side surface of the selection pattern 120, and the upper portion 180U of the passivation layer 180 may cover the side surface of the storage pattern 150. In some embodiments, the passivation layer 180 may extend conformally.

Referring to FIG. 28, the gap fill layer 190 is formed on the passivation layer 180. The formation of the gap fill layer 190 is similar to that described above with reference to FIG. 17, and thus a detailed description will be omitted below.

Subsequently, referring to FIGS. 1, 6, 7A, and 7B, the second conductive line BL is formed on the memory cells MC1 to MC4. The formation of the second conductive line BL is similar to that described above with reference to FIGS. 1 to 3B, and thus a detailed description will be omitted below.

Accordingly, a method for fabricating a semiconductor memory device with improved performance and reliability may be provided.

Figure 29:
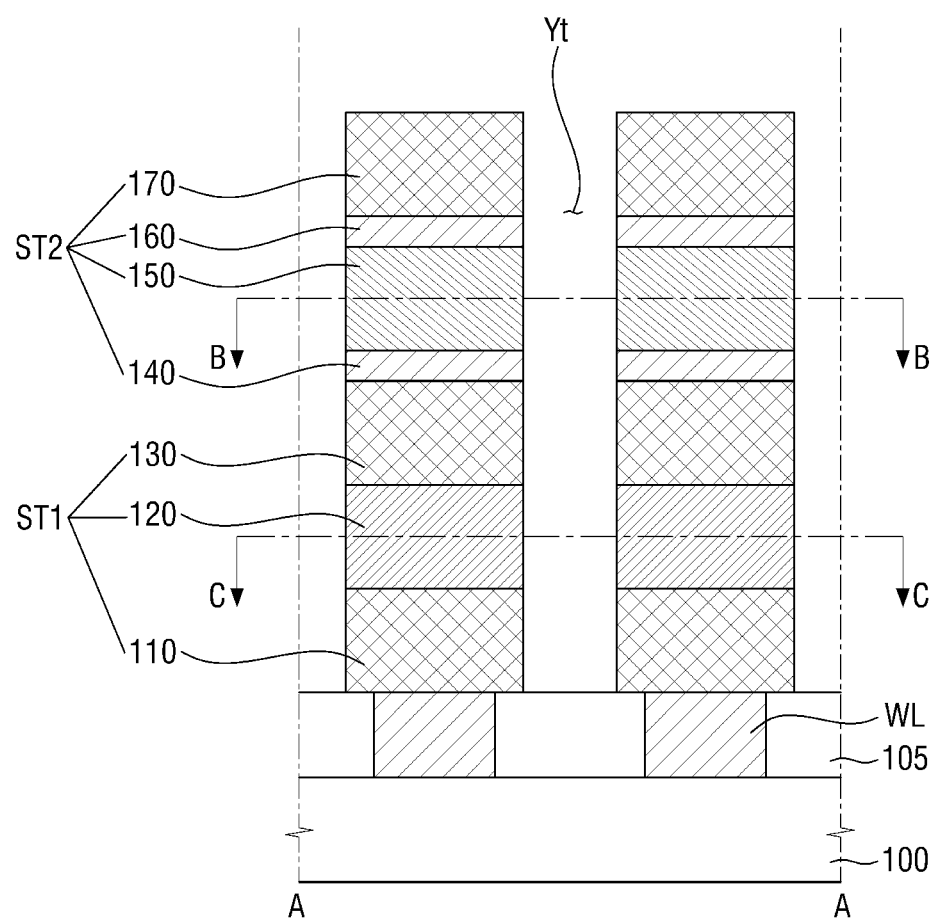
FIGS. 29, 30, 31, 32 and 33 are views illustrating intermediate steps for explaining a method for fabricating a semiconductor memory device according to example embodiments.

FIGS. 29, 30, 31, 32 and 33 are views illustrating intermediate steps for explaining a method for fabricating a semiconductor memory device according to example embodiments. For simplicity of description, redundant parts of the description made with reference to FIGS. 1 to 28 may be recapitulated or omitted. For reference, FIG. 29 is a diagram for describing the steps after FIG. 8.

Figure 30:
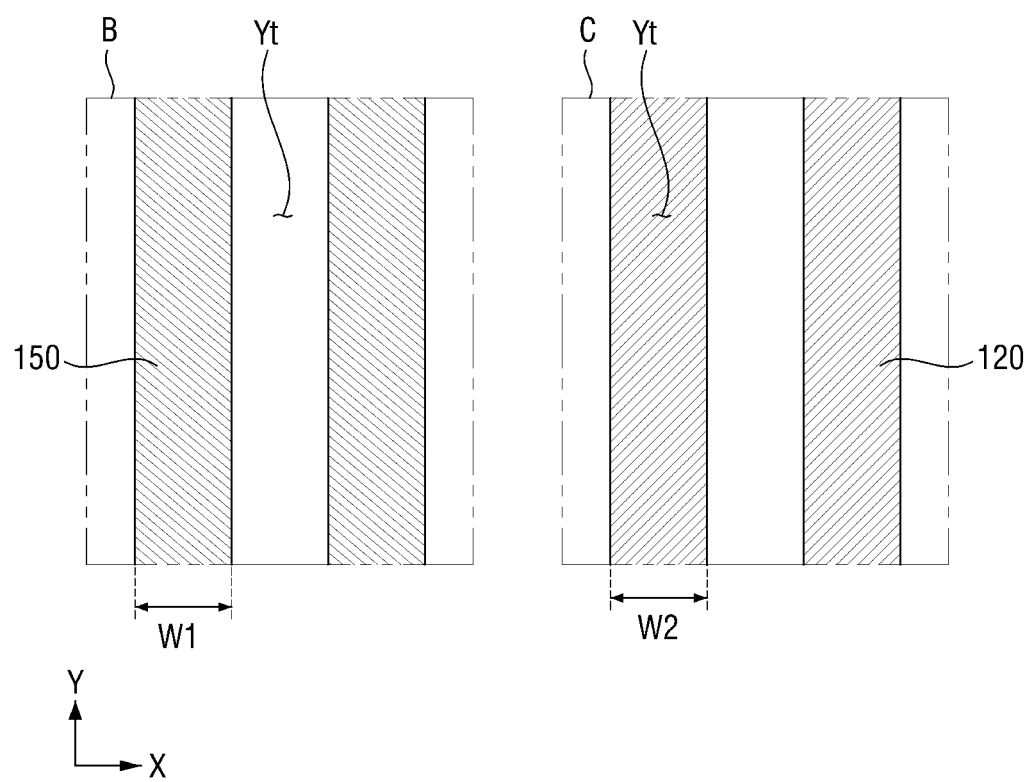

Referring to FIGS. 29 and 30, the lower electrode layer 110a, the selection layer 120a, the middle electrode layer 130a, the first barrier layer 140a, the storage layer 150a, the second barrier layer 160a, and the upper electrode layer 170a are patterned.

Accordingly, a plurality of memory cells MC1 to MC4 including the first stack ST1 and the second stack ST2 may be formed.

In some embodiments, each of the first stack ST1 and the second stack ST2 may be formed to extend in the first direction Y. For example, a plurality of first cutting lines Yt may be formed to extend in the first direction Y and to cut the lower electrode layer 110a, the selection layer 120a, the middle electrode layer 130a, the first barrier layer 140a, the storage layer 150a, the second barrier layer 160a, and the upper electrode layer 170a. Accordingly, each of a plurality of storage patterns 150 and selection patterns 120 spaced apart from each other and extending side by side may be formed.

Figure 31:
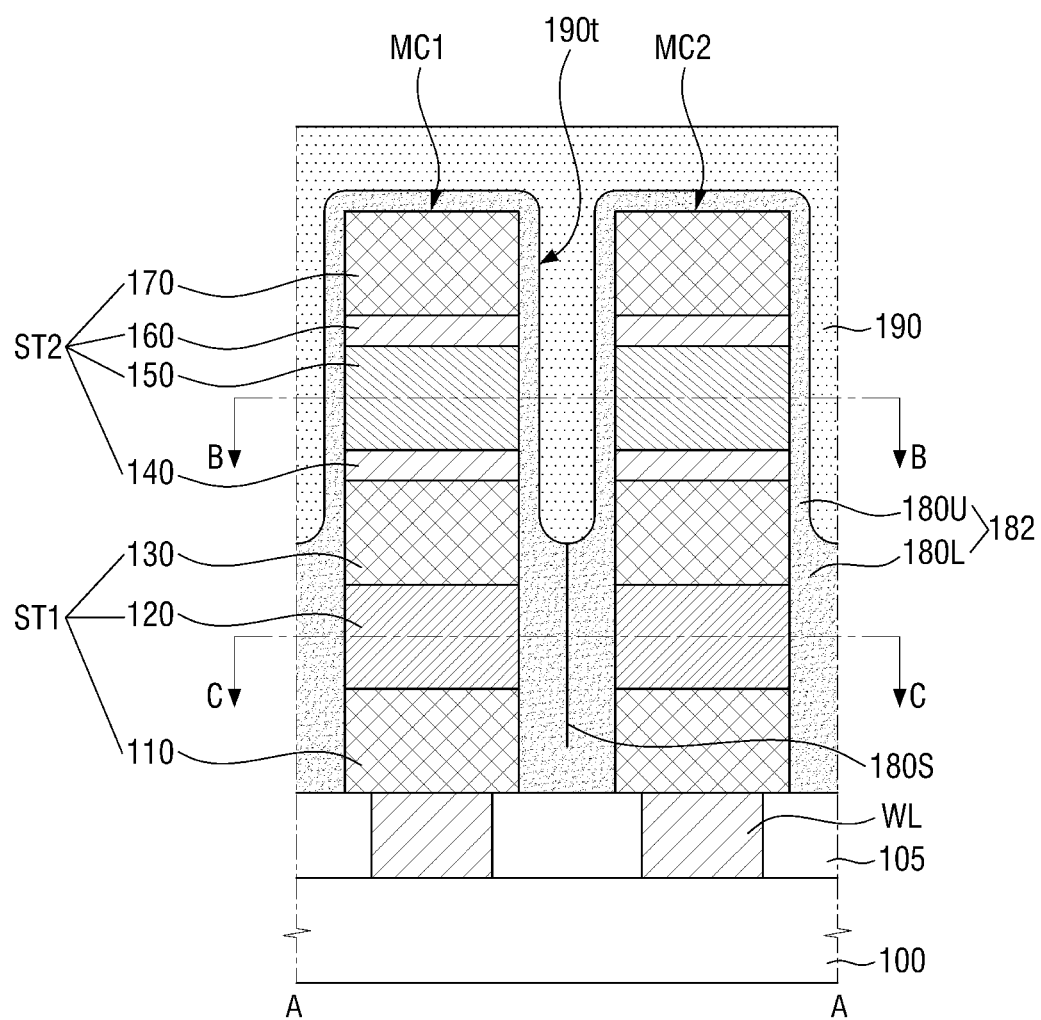
Figure 32:
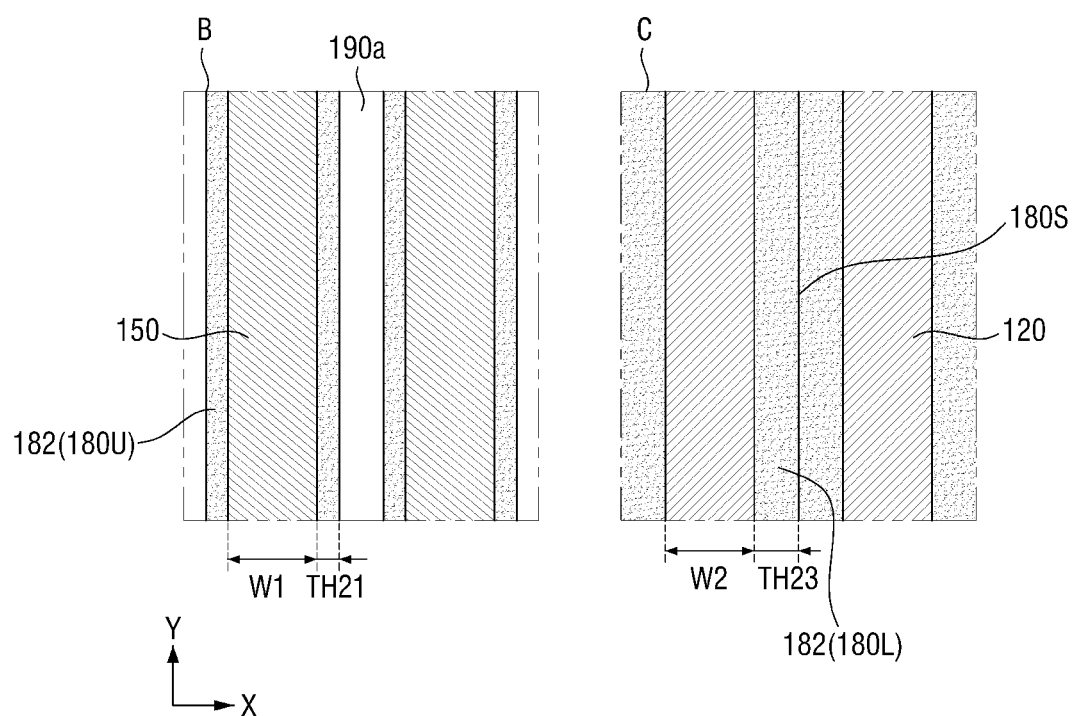

Referring to FIGS. 31 and 32, the passivation layer 180 and the gap fill layer 190 are formed on the first stack ST1 and the second stack ST2. The formation of the passivation layer 180 and the gap fill layer 190 is similar to that described above with reference to FIGS. 14 to 17, or 18 and 19, or 23 to 25, or 27 and 28, and thus a detailed description is omitted below.

Accordingly, the first layer 182 including the lower portion 180L and the upper portion 180U may be formed. The lower portion 180L of the first layer 182 may extend in the first direction Y along the side surface of the selection pattern 120, and the upper portion 180U of the first layer 182 may extend in the first direction Y along the side surface of the storage pattern 150.

In addition, the first portion 190a of the gap fill layer 190 interposed between the upper portions 180U of the adjacent first layers 182 may be formed. The first portion 190a of the gap fill layer 190 may extend in the first direction Y.

Figure 33:
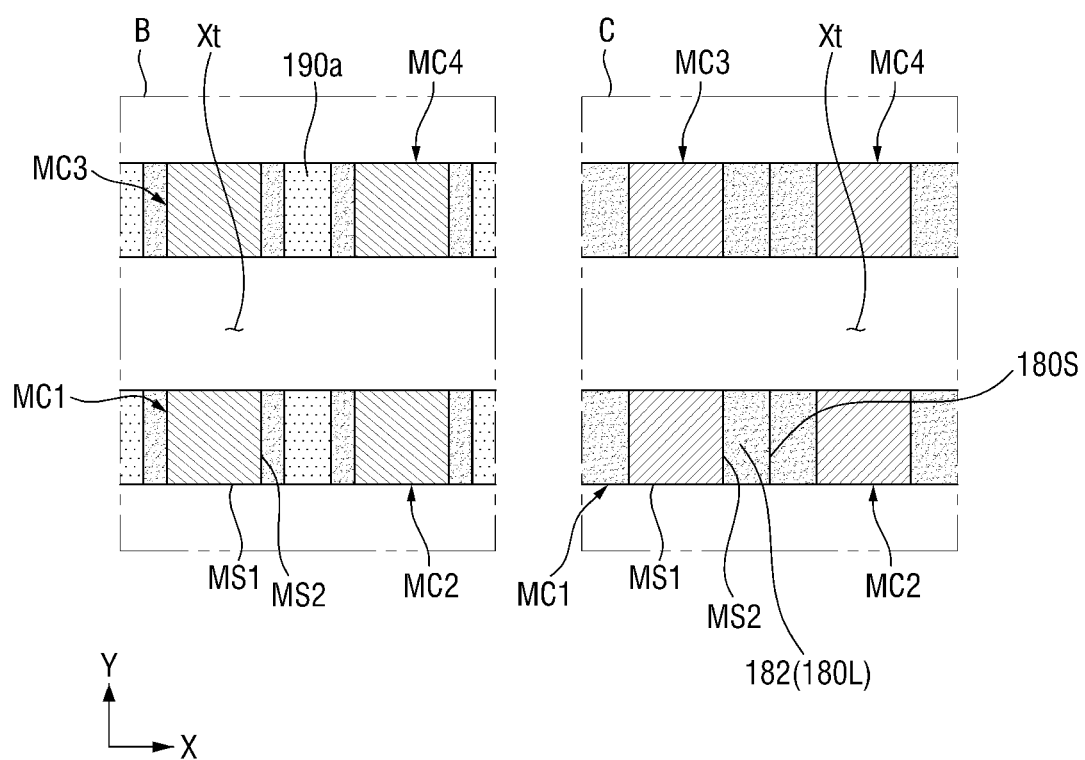

Referring to FIG. 33, the first stack ST1 and the second stack ST2 are patterned.

Accordingly, the memory cells MC1 to MC4 spaced apart from each other to form a plurality of isolated areas may be formed. For example, a plurality of second cutting lines Xt extending in the second direction X and cutting the first stack ST1 and the second stack ST2 may be formed. Each of the memory cells MC1 to MC4 may include the first side surface MS1 extending in the second direction X and the second side surface MS2 extending in the first direction Y.

In some embodiments, the first layer 182 may be patterned by the second cutting lines Xt. Accordingly, the first layer 182 extending in the first direction Y to cover the first side surface MS1 of each of the memory cells MC1 to MC4 may be formed.

Subsequently, the passivation layer 180 and the gap fill layer 190 are formed on the memory cells MC1 to MC4. The formation of the passivation layer 180 and the gap fill layer 190 is similar to that described above with reference to FIGS. 14 to 17, or 18 and 19, or 23 to 25, or 27 and 28, and thus a detailed description is omitted below.

Accordingly, as illustrated in FIGS. 2 and 3C, the second layer 184 including the lower portion 180L and the upper portion 180U may be formed. The lower portion 180L of the second layer 184 may extend in the second direction X along the side surface of the selection pattern 120, and the upper portion 180U of the second layer 184 may extend in the second direction X along the side surface of the storage pattern 150.

In addition, the second portion 190b of the gap fill layer 190 interposed between the upper portions 180U of the adjacent second layers 184 may be formed. The second portion 190b of the gap fill layer 190 may extend in the second direction X.

Subsequently, referring to FIGS. 1, 2 and 3C, the second conductive line BL is formed on the memory cells MC1 to MC4. The formation of the second conductive line BL is similar to that described above with reference to FIGS. 1 to 3B, and thus a detailed description will be omitted below.

Accordingly, a method for fabricating a semiconductor memory device with improved performance and reliability may be provided.

Figure 34:
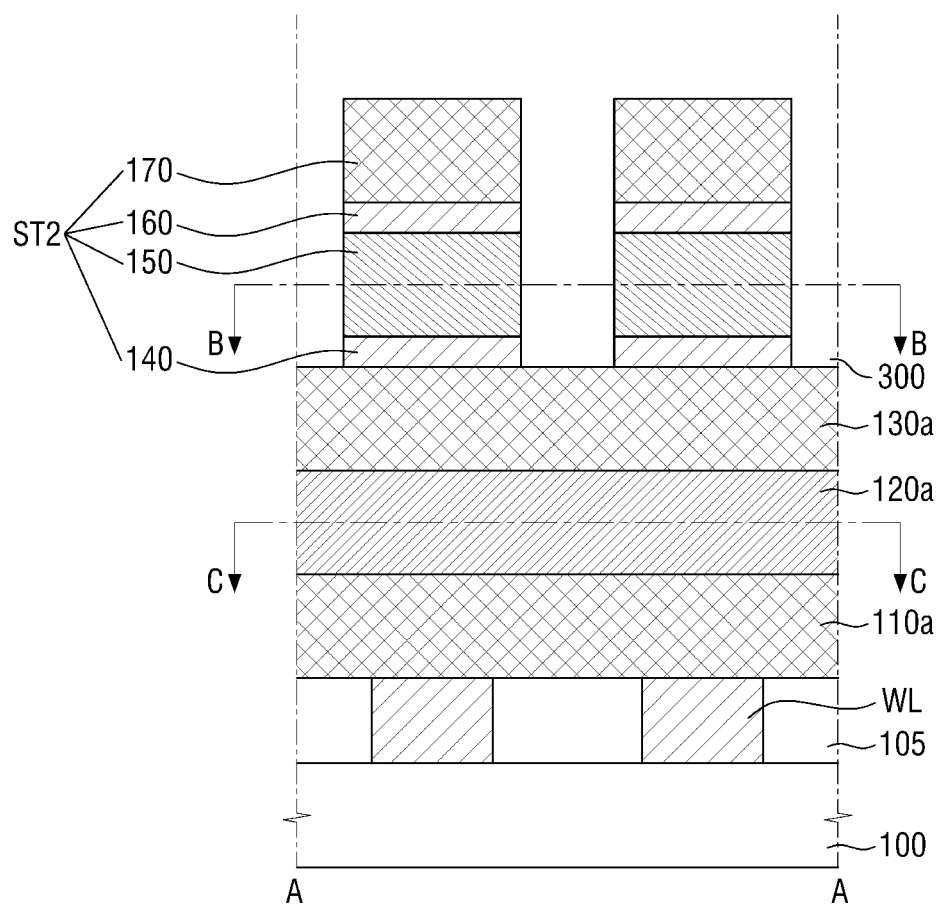
FIGS. 34, 35, 36, 37, 38 and 39 are views illustrating the intermediate steps for explaining a method for fabricating a semiconductor memory device according to example embodiments.

FIGS. 34, 35, 36, 37, 38 and 39 are views illustrating the intermediate steps for explaining a method for fabricating a semiconductor memory device according to some embodiments. For simplicity of description, redundant parts of the description made with reference to FIGS. 1 to 33 may be recapitulated or omitted. For reference, FIG. 34 is a diagram for describing the steps after FIG. 8.

Figure 35:
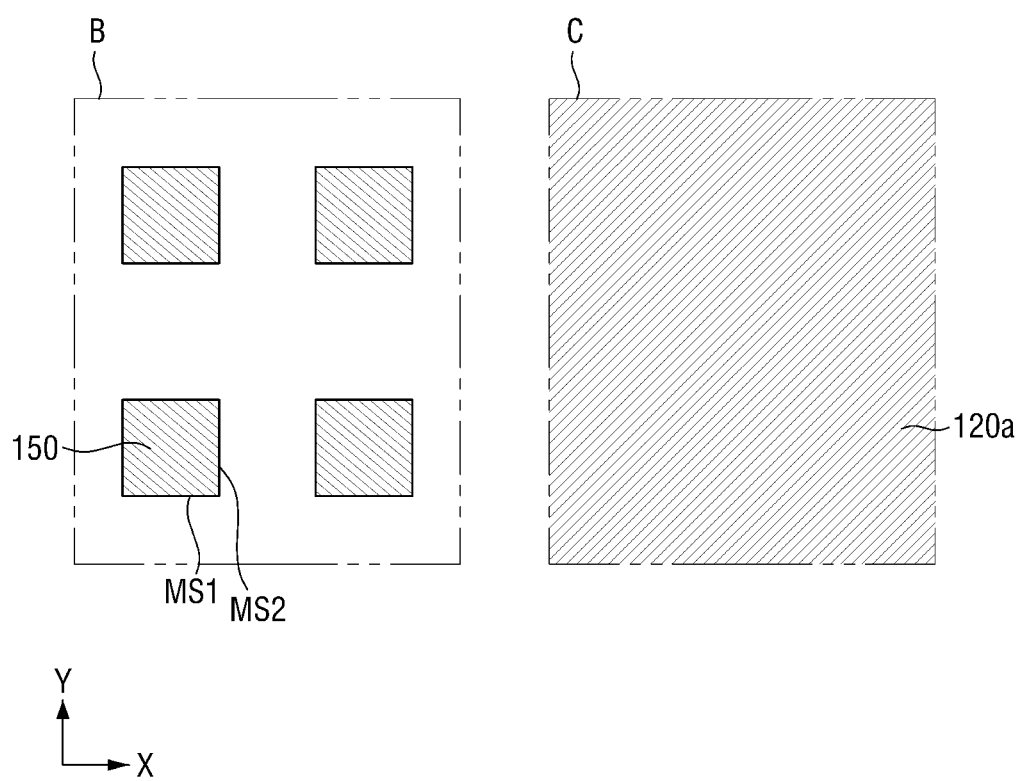

Referring to FIGS. 34 and 35, the first barrier layer 140a, the storage layer 150a, the second barrier layer 160a, and the upper electrode layer 170a are patterned.

Accordingly, the second stack ST2 including the first barrier pattern 140, the storage pattern 150, the second barrier pattern 160, and the upper electrode pattern 170 may be formed. In some embodiments, the second stack ST2 may form a plurality of isolated areas spaced apart from each other. Accordingly, the storage pattern 150 forming a plurality of isolated regions may be formed. In some embodiments, the second stack ST2 may have a rectangular column shape.

Figure 36:
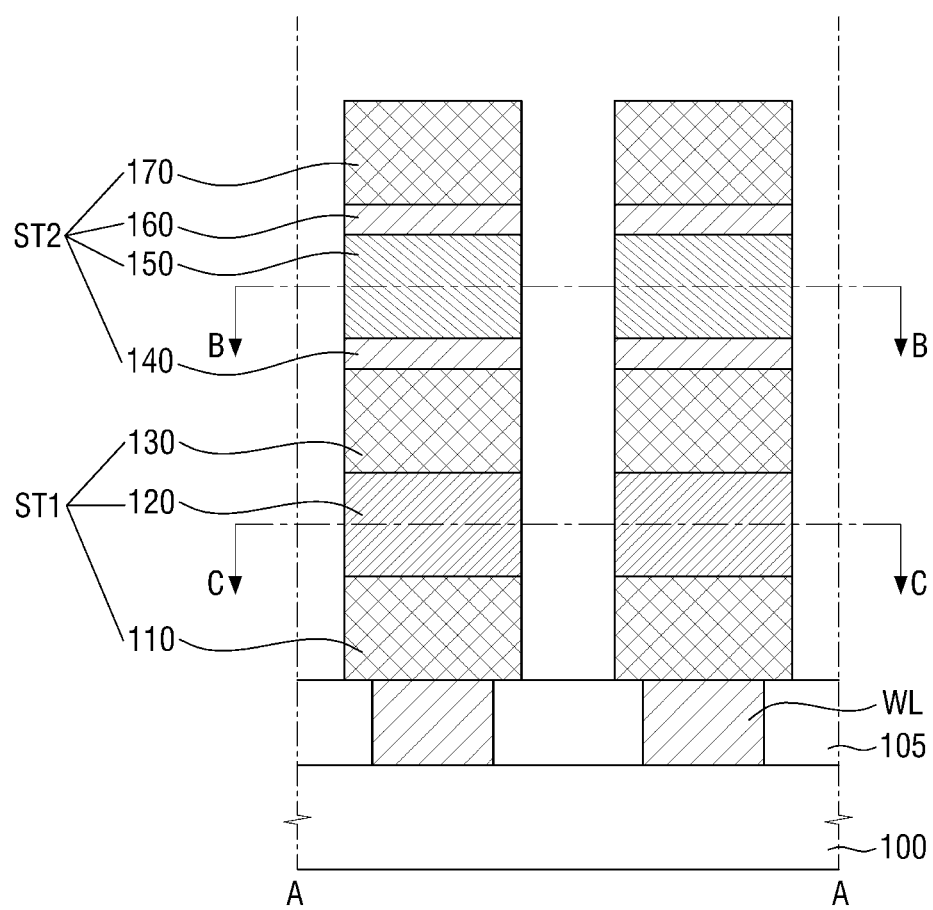
Figure 37:
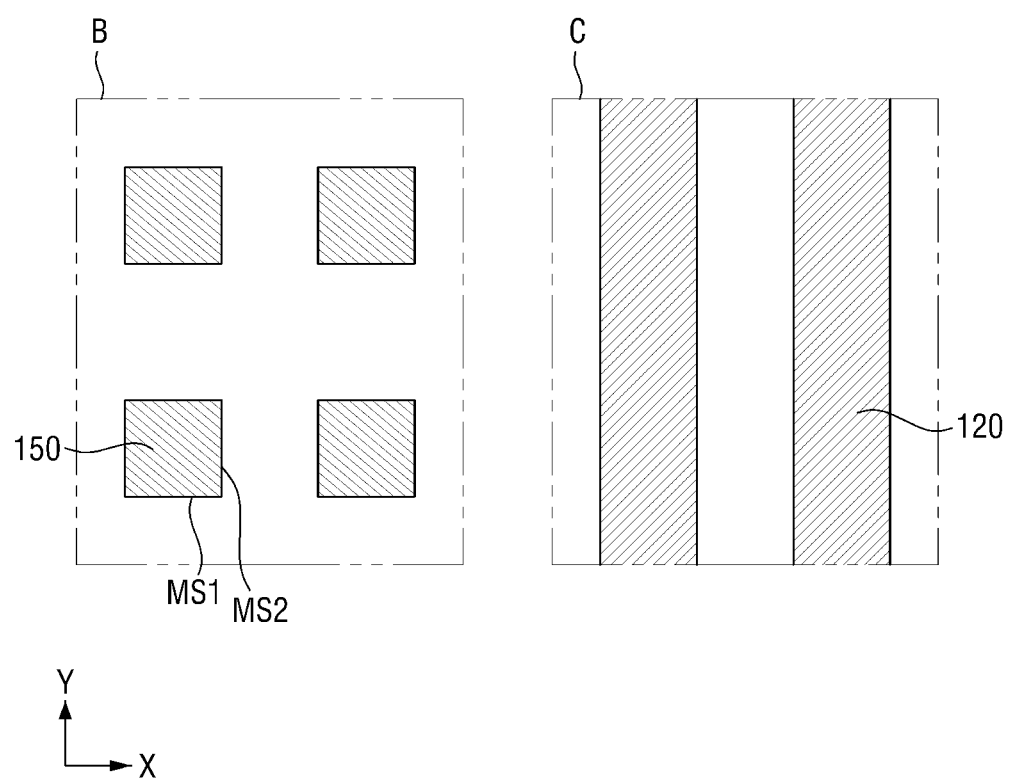

Referring to FIGS. 36 and 37, the lower electrode layer 110a, the selection layer 120a, and the middle electrode layer 130a are patterned.

Accordingly, the first stack ST1 including the lower electrode pattern 110, the selection pattern 120, and the middle electrode pattern 130 may be formed.

Accordingly, a plurality of memory cells MC1 to MC4 including the first stack ST1 and the second stack ST2 may be formed.

In some embodiments, the second stack ST2 may be formed to extend in the first direction Y. Accordingly, a plurality of selection patterns 120 spaced apart from each other and extending side by side may be formed.

Figure 38:
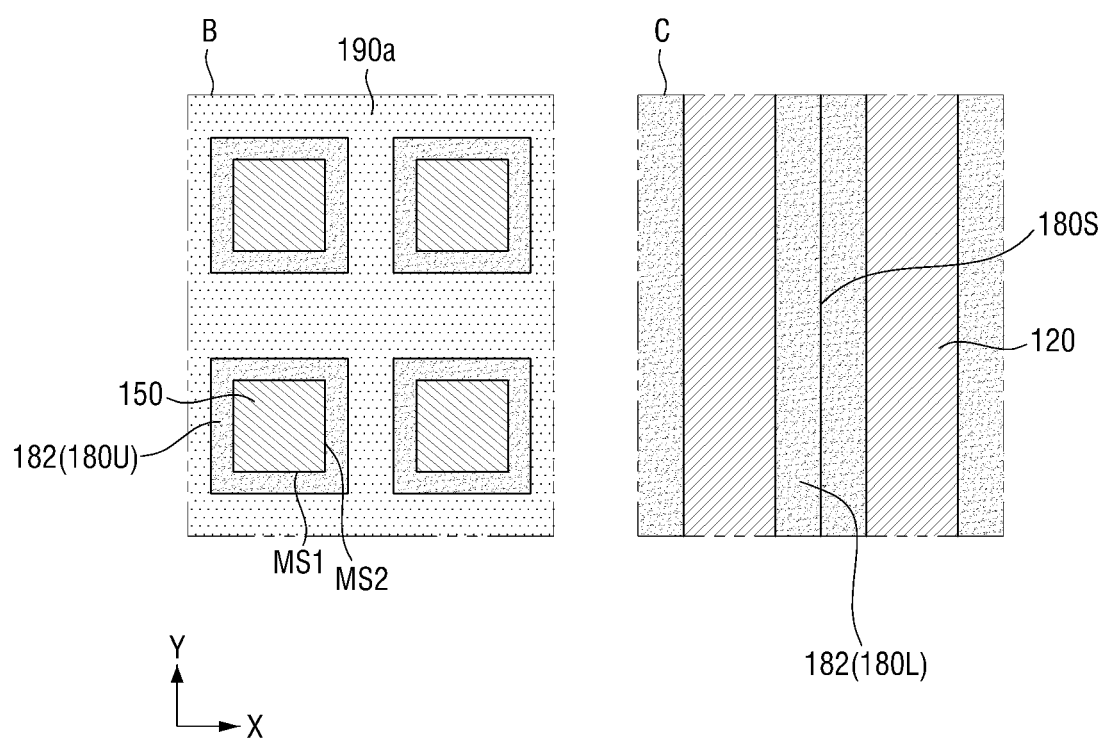

Referring to FIGS. 38, the passivation layer 180 and the gap fill layer 190 are formed on the first stack ST1 and the second stack ST2. The formation of the passivation layer 180 and the gap fill layer 190 is similar to that described above with reference to FIGS. 14 to 17, or 18 and 19, or 23 to 25, or 27 and 28, and thus a detailed description is omitted below.

Accordingly, the first layer 182 including the lower portion 180L and the upper portion 180U may be formed. The lower portion 180L of the first layer 182 may cover the first side surface MS1 and the second side surface MS2 of the selection pattern 120, and the upper portion 180U of the first layer 182 may extend in the first direction Y along the side surface of the storage pattern 150.

In addition, the first portion 190a of the gap fill layer 190 interposed between the upper portions 180U of the first layers 182 may be formed. The first portion 190a of the gap fill layer 190 may fill a space between the upper portions 180U of the first layers 182.

Figure 39:
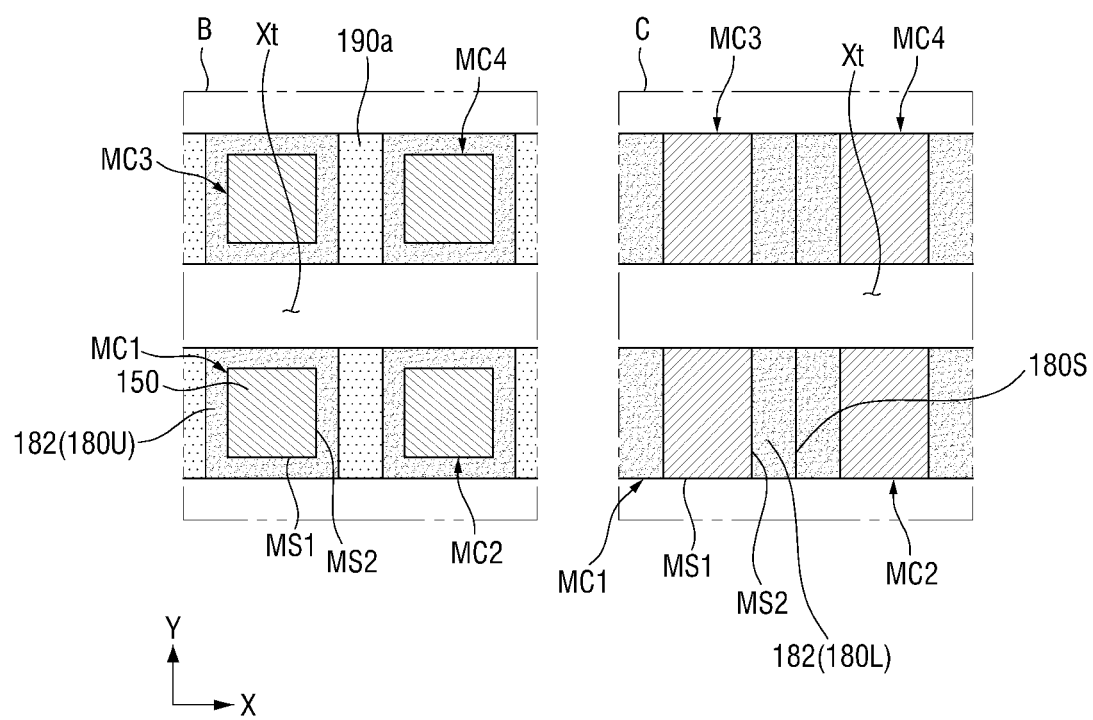

Referring to FIG. 39, the first stack ST1 and the second stack ST2 are patterned.

Accordingly, the memory cells MC1 to MC4 spaced apart from each other to form a plurality of isolated areas may be formed. For example, a plurality of second cutting lines Xt extending in the second direction X and cutting the first stack ST1 and the second stack ST2 may be formed.

Subsequently, the passivation layer 180 and the gap fill layer 190 are formed on the memory cells MC1 to MC4. The formation of the passivation layer 180 and the gap fill layer 190 is similar to that described above with reference to FIGS. 14 to 17, or 18 and 19, or 23 to 25, or 27 and 28, and thus a detailed description is omitted below.

Accordingly, as illustrated in FIGS. 2 and 3D, the second layer 184 including the lower portion 180L and the upper portion 180U may be formed. The lower portion 180L of the second layer 184 may extend in the second direction X along the side surface of the selection pattern 120, and the upper portion 180U of the second layer 184 may extend in the second direction X along the side surface of the storage pattern 150.

In addition, the second portion 190b of the gap fill layer 190 interposed between the upper portions 180U of the adjacent second layers 184 may be formed. The second portion 190b of the gap fill layer 190 may extend in the second direction X.

Subsequently, referring to FIGS. 1, 2, and 3D, the second conductive line BL is formed on the memory cells MC1 to MC4. The formation of the second conductive line BL is similar to that described above with reference to FIGS. 1 to 3B, and thus a detailed description will be omitted below.

Accordingly, a method for fabricating a semiconductor memory device with improved performance and reliability may be provided.

In concluding the detailed description, those skilled in the art will appreciate that many variations and modifications can be made to the example embodiments without substantially departing from the principles of the disclosure. Therefore, the disclosed embodiments are used in a generic and descriptive sense only and not for purposes of limitation.

What is claimed is:

1. A semiconductor memory device comprising:
    a first memory cell provided on a substrate;
    a second memory cell provided on the substrate and spaced apart from the first memory cell;
    a passivation layer extending along a side surface of the first memory cell and a side surface of the second memory cell; and
    a gap fill layer covering the passivation layer,
    wherein each of the first memory cell and the second memory cell comprises:
        a selection pattern having ovonic threshold switching characteristics; and
        a storage pattern provided on the selection pattern,
    wherein the passivation layer comprises:
        a lower portion filling a space between the selection pattern of the first memory cell and the selection pattern of the second memory cell; and
        an upper portion extending along a side surface of the storage pattern of each of the first memory cell and the second memory cell,
    wherein the gap fill layer is not interposed between the selection pattern of the first memory cell and the selection pattern of the second memory cell,
    wherein the gap fill layer is interposed between the storage pattern of the first memory cell and the storage pattern of the second memory cell, and
    wherein the gap fill layer comprises a material having a lower thermal conductivity than the passivation layer.

2. The semiconductor memory device of claim 1, wherein the lower portion of the passivation layer comprises a seam extending in a direction crossing a top surface of the substrate and interposed between the first memory cell and the second memory cell.

3. The semiconductor memory device of claim 2, wherein a first thickness of the upper portion of the passivation layer from the side surface of the storage pattern of one among the first memory cell and the second memory cell to the gap fill layer is less than a second thickness of the lower portion of the passivation layer from a side surface of the selection pattern to the seam.

4. The semiconductor memory device of claim 1, wherein a first width of the storage pattern of one among the first memory cell and the second memory cell is less than a second width of the selection pattern of the one among the first memory cell and the second memory cell.

5. The semiconductor memory device of claim 4, wherein the passivation layer conformally extends along the side surface of the first memory cell and the side surface of the second memory cell.

6. The semiconductor memory device of claim 1, wherein each of a width of the first memory cell and a width of the second memory cell decreases from a top surface of the substrate to a top surface of a respective one among the first memory cell and the second memory cell.

7. The semiconductor memory device of claim 6, wherein the passivation layer conformally extends along the side surface of the first memory cell and the side surface of the second memory cell.

8. The semiconductor memory device of claim 1, further comprising a third memory cell provided on the substrate and spaced apart from the first memory cell and the second memory cell,
    wherein the third memory cell comprises the selection pattern and the storage pattern,
    wherein the first memory cell and the second memory cell are provided along a first direction,
    wherein the first memory cell and the third memory cell are provided along a second direction crossing the first direction, and
    wherein the gap fill layer is interposed between the selection pattern of the second memory cell and the selection pattern of the third memory cell.

9. The semiconductor memory device of claim 1, wherein each of the first memory cell and the second memory cell further comprises:
- a lower electrode pattern interposed between the substrate and the selection pattern;
- a middle electrode pattern interposed between the selection pattern and the storage pattern; and
- an upper electrode pattern provided on the storage pattern.

10. The semiconductor memory device of claim 1, wherein the selection pattern comprises a chalcogenide material, and
wherein the storage pattern comprises GeSbTe (GST).

11. The semiconductor memory device of claim 1, wherein the passivation layer comprises any one or any combination of silicon oxide, aluminum oxide, silicon nitride, silicon oxynitride, silicon carbide, silicon carbonitride, and silicon oxycarbonitride.

12. A semiconductor memory device comprising:
- a substrate;
- a plurality of first conductive lines provided on the substrate, each of the plurality of first conductive lines extending in a first direction;
- a plurality of second conductive lines provided on the substrate, each of the plurality of second conductive lines extending in a second direction crossing the first direction;
- a plurality of memory cells respectively disposed at intersections of the plurality of first conductive lines and the plurality of second conductive lines;
- a passivation layer extending along a side surface of each of the plurality of memory cells; and
- a gap fill layer covering the passivation layer,
wherein each of the plurality of memory cells comprises a lower electrode pattern, a selection pattern, a middle electrode pattern, a storage pattern, and an upper electrode pattern that are sequentially stacked on the substrate,
wherein a first thickness of the passivation layer surrounding the storage pattern is less than a second thickness of the passivation layer surrounding the selection pattern, and
wherein the gap fill layer comprises a material having a lower thermal conductivity than the passivation layer.

13. The semiconductor memory device of claim 12, wherein the plurality of memory cells comprises a first memory cell and a second memory cell adjacent to the first memory cell, and
wherein the gap fill layer is not interposed between the selection pattern of the first memory cell and the selection pattern of the second memory cell.

14. The semiconductor memory device of claim 12, wherein each of the lower electrode pattern, the middle electrode pattern, and the upper electrode pattern comprises a carbon (C) layer.

15. The semiconductor memory device of claim 14, wherein each of the plurality of memory cells further comprises:
- a first barrier pattern interposed between the middle electrode pattern and the storage pattern; and
- a second barrier pattern interposed between the storage pattern and the upper electrode pattern.

16. The semiconductor memory device of claim 15, wherein each of the first barrier pattern and the second barrier pattern comprises tungsten (W).

17. The semiconductor memory device of claim 12, wherein each of the plurality of memory cells comprises:
- a first side surface extending in the second direction; and
- a second side surface extending in the first direction, and
wherein the passivation layer comprises:
- a first layer extending in the first direction and covering the second side surface; and
- a second layer extending in the second direction and covering the first side surface and a side surface of the first layer.

* * * * *